US011508911B2

(12) United States Patent
Kosco et al.

(10) Patent No.: US 11,508,911 B2
(45) Date of Patent: Nov. 22, 2022

(54) RECORD PHOTOCATALYTIC HYDROGEN EVOLUTION FROM ORGANIC SEMICONDUCTOR HETEROJUNCTION NANOPARTICLES

(71) Applicants: KING ABDULLAH UNIVERSITY OF SCIENCE AND TECHNOLOGY, Thuwal (SA); IMPERIAL COLLEGE, London (GB)

(72) Inventors: Jan Kosco, Thuwal (SA); Matthew Bidwell, London (GB); Hyojung Cha, London (GB); Calvyn T. Howells, Thuwal (SA); James R. Durrant, London (GB); Iain McCulloch, Thuwal (SA)

(73) Assignees: KING ABDULLAH UNIVERSITY OF SCIENCE AND TECHNOLOGY, Thuwal (SA); IMPERIAL COLLEGE LONDON, London (GB)

( * ) Notice: Subject to any disclaimer, the term of this patent is extended or adjusted under 35 U.S.C. 154(b) by 0 days.

(21) Appl. No.: 17/639,966

(22) PCT Filed: Sep. 11, 2020

(86) PCT No.: PCT/IB2020/058448
§ 371 (c)(1),
(2) Date: Mar. 3, 2022

(87) PCT Pub. No.: WO2021/048798
PCT Pub. Date: Mar. 18, 2021

(65) Prior Publication Data
US 2022/0271230 A1 Aug. 25, 2022

Related U.S. Application Data

(60) Provisional application No. 62/898,671, filed on Sep. 11, 2019.

(51) Int. Cl.
H01L 51/00 (2006.01)
C25B 1/55 (2021.01)
(Continued)

(52) U.S. Cl.
CPC .......... *H01L 51/0036* (2013.01); *B01J 23/42* (2013.01); *B01J 35/0013* (2013.01);
(Continued)

(58) Field of Classification Search
CPC .................................................. H01L 51/0036
See application file for complete search history.

(56) References Cited

U.S. PATENT DOCUMENTS 9,656,243 B2 * 5/2017 Wang ................... B01J 35/1047
9,776,162 B2 * 10/2017 Kumari ................ B01J 37/0207
(Continued)

OTHER PUBLICATIONS

International Search Report and Written Opinion received in PCT Application No. PCT/IB2020/058488 dated Jan. 3, 2021.
(Continued)

*Primary Examiner* — Douglas M Menz
(74) *Attorney, Agent, or Firm* — Ajay A. Jagtiani; Miles & Stockbridge P.C.

(57) ABSTRACT

A nanoparticle comprises an internal D/A heterojunction, wherein the nanoparticle comprises a HER rate of 64,426±7022 $\mu$molh$^{-1}$g$^{-1}$ under broadband visible light illumination. Measured EQEs of the nanoparticle throughout a visible spectrum exceed 5% at 660 to 700 nm. Methods may include fabricating a nanoparticle comprising: preparing individual stock solutions of PTB7-TH and EH-IDTBR in chloroform; heating the individual stock solutions to a complete dissolution; filtering the individual stock solutions; preparing a nanoparticle precursor solution from the filtered individual stock solutions by mixing the individual stock solutions in a ratio of 0-100% EH-IDTBR adding a portion
(Continued)

of the nanoparticle precursor solution to a solution of surfactant (SDS or TEBS) in water and mixing to form a pre-emulsion; sonicating the pre-emulsion to form a mini-emulsion; heating the mini-emulsion to remove the chloroform to thereby form a surfactant stabilized nanoparticle dispersion; and filtering the nanoparticle.

20 Claims, 22 Drawing Sheets

(51) Int. Cl.
  C25B 1/02      (2006.01)
  B01J 35/00     (2006.01)
  B01J 37/34     (2006.01)
  B01J 23/42     (2006.01)
  B82Y 40/00     (2011.01)
  B82Y 20/00     (2011.01)

(52) U.S. Cl.
  CPC ............ B01J 37/344 (2013.01); C25B 1/02 (2013.01); C25B 1/55 (2021.01); B82Y 20/00 (2013.01); B82Y 40/00 (2013.01)

(56) References Cited

U.S. PATENT DOCUMENTS

| | | | |
|---|---|---|---|
| 10,576,447 B2* | 3/2020 | Mi | H01L 21/02499 |
| 10,717,072 B2* | 7/2020 | Devi | B01J 23/80 |
| 11,050,075 B1* | 6/2021 | Vajo | C01B 3/006 |
| 11,111,164 B2* | 9/2021 | Bhattacharjee | C01G 49/12 |
| 2006/0283701 A1* | 12/2006 | Li | B01J 35/004 204/157.52 |
| 2012/0103825 A1* | 5/2012 | Oh | C25B 1/55 977/939 |
| 2013/0142726 A1* | 6/2013 | Biniwale | C01B 3/26 423/648.1 |
| 2014/0295518 A1* | 10/2014 | Rayalu | C12P 3/00 435/168 |
| 2016/0193595 A1* | 7/2016 | Nagpal | B01J 23/72 502/220 |
| 2016/0318010 A1* | 11/2016 | Devi | B01J 31/06 |
| 2017/0216810 A1* | 8/2017 | Mi | H01L 21/02603 |
| 2020/0240027 A1* | 7/2020 | Chen | C25B 1/04 |
| 2021/0060533 A1* | 3/2021 | Whang | B01J 35/1019 |

OTHER PUBLICATIONS

Colberts et al., "Aqueous Nanoparticle Polymer Solar Cells: Effects of Surfactant Concentration and Processing on Device Performance", Applied Materials & Interfaces, vol. 9, pp. 13380-13389 (2017).
Hao et al., "Zn-vacancy mediated electron-hole separation in ZnS/g-C3N4 heterojunction for efficient visible-light photocatalytic hydrogen production", Applied Catalyst B: Environmental, vol. 229, pp. 41-51 (2018).
Kosco et al., "Enhanced photocatalytic hydrogen evolution from organic semiconductor heterojunction nanoparticles", Nature Materials; vol. 19, pp. 559-565 (2020).
Steier et al., "A bright outlook for photoelectrochemical cells for water spitting", Journal of Materials Chemistry A, vol. 6, pp. 21809-21826 (2018).
Li et al., "A BiOcl/B-FeOOH heterojunction for HER photocatalytic performance under visible-light illumination", International Journal of Energy Research, vol. 43, Issue 6, pp. 2162-2171 (2019).
Yin et al., "MoSx/CdS nano-heterostructures accurately contructed on the defects of CdS for efficient photocatalytic H2 evolution under visible light irradiation", Chemical Engineering Journal, vol. 370, pp. 305-313 (2019).

Hoffert, M. I. et al. Advanced technology paths to global climate stability: energy for a greenhouse planet. Science 298, 981-7 (2002).
Creutzig, F. et al. The underestimated potential of solar energy to mitigate climate change. Nat. Energy 2, 17140 (2017).
Pinaud, B. A. et al. Technical and economic feasibility of centralized facilities for solar hydrogen production via photocatalysis and photoelectrochemistry. Energy Environ. Sci. 6, 1983 (2013).
Fujishima, A. & Honda, K. Electrochemical Photolysis of Water at a Semiconductor Electrode. Nature 238, 37-38 (1972).
Goto, Y. et al. A Particulate Photocatalyst Water-Splitting Panel for Large-Scale Solar Hydrogen Generation. Joule 2, 509-520 (2018).
Wang, X. et al. A metal-free polymeric photocatalyst for hydrogen production from water under visible light. Nat. Mater. 8, 76-80 (2009).
Zhang, G. et al. Ionothermal Synthesis of Triazine-Heptazine-Based Copolymers with Apparent Quantum Yields of 60% at 420 nm for Solar Hydrogen Production from "Sea Water". Angew. Chemie Int. Ed. 57, 9372-9376 (2018).
Maeda, K. & Domen, K. Photocatalytic Water Splitting: Recent Progress and Future Challenges. J. Phys. Chem. Lett. 1, 2655-2661 (2010).
Wang, Y. et al. Mimicking Natural Photosynthesis: Solar to Renewable H 2 Fuel Synthesis by Z-Scheme Water Splitting Systems. Chem. Rev. 118, 5201-5241 (2018).
Bamwenda, G. R. & Arakawa, H. The visible light induced photocatalytic activity of tungsten trioxide powders. Appl. Catal. A Gen. 210, 181-191 (2001).
Zhu, M., Sun, Z., Fujitsuka, M. & Majima, T. Z-Scheme Photocatalytic Water Splitting on a 2D Heterostructure of Black Phosphorus/Bismuth Vanadate Using Visible Light. Angew Chemie Int. Ed. 57, 2160-2164 (2018).
Kim, J. H. & Lee, J. S. Elaborately Modified BiVO 4 Photoanodes for Solar Water Splitting. Adv. Mater. 31, 1806938 (2019).
Zhang, P., Zhang, J. & Gong, J. Tantalum-based semiconductors for solar water splitting. Chem. Soc. Rev. 43, 4395-4422 (2014).
Yuan, Y.-J., Chen, D., Yu, Z.-T. & Zou, Z.-G. Cadmium sulfide-based nanomaterials for photocatalytic hydrogen production. J. Mater. Chem. A 6, 11606-11630 (2018).
Zhu, X. et al. Black Phosphorus Revisited: A Missing Metal-Free Elemental Photocatalyst for Visible Light Hydrogen Evolution. Adv. Mater. 29, 1605776 (2017).
Sachs, M. et al. Understanding structure-activity relationships in linear polymer photocatalysts for hydrogen evolution. Nat. Commun 9, 4968 (2018).
Zhang, X. et al. Biomass Nanomicelles Assist Conjugated Polymers/Pt Cocatalysts to Achieve High Photocatalytic Hydrogen Evolution. ACS Sustain. Chem. Eng. 7, 4128-4135 (2019).
Banerjee, T. & Lotsch, B. V. The wetter the better. Nat. Chem. 10, 1175-1177 (2018).
Mikhnenko, O. V., Blom, P. W. M. & Nguyen, T.-Q. Exciton diffusion in organic semiconductors. Energy Environ. Sci. 8, 1867-1888 (2015).
Sun, C. et al. Interface design for high-efficiency non-fullerene polymer solar cells. Energy Environ. Sci. 10, 1784-1791 (2017).
Wang, X. et al. Sulfone-containing covalent organic frameworks for photocatalytic hydrogen evolution from water. Nat. Chem. 10, 1180-1189 (2018).
Takanabe, K. et al. Photocatalytic hydrogen evolution on dye-sensitized mesoporous carbon nitride photocatalyst with magnesium phthalocyanine. Phys. Chem. Chem. Phys. 12, 13020 (2010).
Low, J., Yu, J., Jaroniec, M., Wageh, S. & Al-Ghamdi, A. A. Heterojunction Photocatalysts. Adv. Mater. 29, 1601694 (2017).
Richards, J. J., Whittle, C. L., Shao, G. & Pozzo, L. D. Correlating Structure and Photocurrent for Composite Semiconducting Nanoparticles with Contrast Variation Small-Angle Neutron Scattering and Photoconductive Atomic Force Microscopy. ACS Nano 8, 4313-4324 (2014).
Wang, L. et al. Organic Polymer Dots as Photocatalysts for Visible Light-Driven Hydrogen Generation. Angew. Chemie Int. Ed. 55, 12306-12310 (2016).

(56) References Cited

OTHER PUBLICATIONS

Kosco, J. et al. The Effect of Residual Palladium Catalyst Contamination on the Photocatalytic Hydrogen Evolution Activity of Conjugated Polymers. Adv. Energy Mater. 1802181 (2018). doi:10.1002/aenm.201802181.

Liu, A., Tai, C.-W., Holá, K. & Tian, H. Hollow polymer dots: nature-mimicking architecture for efficient photocatalytic hydrogen evolution reaction. J. Mater. Chem. A 7, 4797-4803 (2019).

Trasatti, S. The absolute electrode potential: an explanatory note (Recommendations 1986). J. Electroanal. Chem. Interfacial Electrochem. 209, 417-428 (1986).

Staff, R. H., Landfester, K. & Crespy, D. Recent Advances in the Emulsion Solvent Evaporation Technique for the Preparation of Nanoparticles and Nanocapsules. in 329 344 (Springer, Cham, 2013). doi:10.1007/12_2013_233.

Cha, H. et al. Suppression of Recombination Losses in Polymer:Nonfullerene Acceptor Organic Solar Cells due to Aggregation Dependence of Acceptor Electron Affinity. Adv. Energy Mater. 9, 1901254 (2019).

Schwarz, K. N., Farley, S. B., Smith, T. A. & Ghiggino, K. P. Charge generation and morphology in P3HT: PCBM nanoparticles prepared by mini-emulsion and reprecipitation methods. Nanoscale 7, 19899-19904 (2015).

Ulum, S. et al. Determining the structural motif of P3HT:PCBM nanoparticulate organic photovoltaic devices. Sol. Energy Mater. Sol. Cells 110, 43-48 (2013).

Holmes, N. P. et al. Nano-domain behaviour in P3HT:PCBM nanoparticles, relating material properties to morphological changes. Sol. Energy Mater. Sol. Cells 117, 437-445 (2013).

Ge, X. et al. Four reversible and reconfigurable structures for three-phase emulsions: extended morphologies and applications. Sci. Rep. 7, 42738 (2017).

Subianto, S. et al. Sulfonated Thiophene Derivative Stabilized Aqueous Poly(3-hexylthiophene):Phenyl-C 61 -butyric Acid Methyl Ester Nanoparticle Dispersion for Organic Solar Cell Applications. ACS Appl. Mater. Interfaces 10, 44116-44125 (2018).

Baran, D. et al. Robust nonfullerene solar cells approaching unity external quantum efficiency enabled by suppression of geminate recombination. Nat. Commun. 9, 2059 (2018).

Holliday, S. Extended Linear Acceptors with an Indacenodithiophene Core. in 63-85 (Springer, Cham, 2018). doi: 10.1007/978-3-319-77091-8_4.

Huang, L. et al. Vertical Stratification Engineering for Organic Bulk-Heterojunction Devices. ACS Nano 12, 4440-4452 (2018).

Holliday, S. et al. High-efficiency and air-stable P3HT-based polymer solar cells with a new non-fullerene acceptor. Nat. Commun. 7, 11585 (2016).

Endo, H., Schwahn, D. & Cölfen, H. On the role of block copolymer additives for calcium carbonate crystallization: Small angle neutron scattering investigation by applying contrast variation. J. Chem. Phys. 120, 9410-9423 (2004).

McKone, J. R., Marinescu, S. C., Brunschwig, B. S., Winkler, J. R. & Gray, H. B. Earth-abundant hydrogen evolution electrocatalysts. Chem. Sci. 5, 865-878 (2014).

Stegbauer, L., Schwinghammer, K. & Lotsch, B. V. A hydrazone-based covalent organic framework for photocatalytic hydrogen production. Chem. Sci. 5, 2789-2793 (2014).

Qureshi, M. & Takanabe, K. Insights on Measuring and Reporting Heterogeneous Photocatalysis: Efficiency Definitions and Setup Examples. Chem. Mater. 29, 158-167 (2017).

Maeda, K. et al. Photocatalytic Activities of Graphitic Carbon Nitride Powder for Water Reduction and Oxidation under Visible Light. J. Phys. Chem. C 113, 4940-4947 (2009).

Haselmann, G. M. & Eder, D. Early-Stage Deactivation of Platinum-Loaded TiO 2 Using In Situ Photodeposition during Photocatalytic Hydrogen Evolution. ACS Catal. 7, 4668-4675 (2017).

Zhang, G., Lan, Z.-A. & Wang, X. Conjugated Polymers: Catalysts for Photocatalytic Hydrogen Evolution. Angew. Chemie Int. Ed. 55, 15712-15727 (2016).

Pati, P. B. et al. An experimental and theoretical study of an efficient polymer nano-photocatalyst for hydrogen evolution. Energy Environ. Sci. 10, 1372-1376 (2017).

Zou, X. & Zhang, Y. Noble metal-free hydrogen evolution catalysts for water splitting. Chem. Soc. Rev. 44, 5148-5180 (2015).

Yu, J., Low, J., Xiao, W., Zhou, P. & Jaroniec, M. Enhanced Photocatalytic CO 2 -Reduction Activity of Anatase TiO 2 by Coexposed {001} and {101} Facets. J. Am. Chem. Soc. 136, 8839-8842 (2014).

Li, H., Shang, J., Ai, Z. & Zhang, L. Efficient Visible Light Nitrogen Fixation with BiOBr Nanosheets of Oxygen Vacancies on the Exposed {001} Facets. J. Am. Chem. Soc. 137, 6393-6399 (2015).

* cited by examiner

Particle diameter measured: 95.2 nm
EH-IDTBR diameter measured: 84.7 nm
EH-IDTBR diameter predicted: 84.5 nm

RECORD PHOTOCATALYTIC HYDROGEN EVOLUTION FROM ORGANIC SEMICONDUCTOR HETEROJUNCTION NANOPARTICLES

CROSS-REFERENCE TO RELATED APPLICATIONS

This application is a National Stage of International Application No. PCT/IB2020/058448 with an international filing date of Sep. 11, 2020, entitled "RECORD PHOTOCATALYTIC HYDROGEN EVOLUTION FROM ORGANIC SEMICONDUCTOR HETEROJUNCTION NANOPARTICLES", which claims benefit of priority to U.S. Provisional Patent Application No. 62/898,671, entitled "RECORD PHOTOCATALYTIC HYDROGEN EVOLUTION FROM ORGANIC SEMICONDUCTOR HETEROJUNCTION NANOPARTICLES" filed Sep. 11, 2019. The entire contents and disclosures of these patent applications are incorporated herein by reference in their entirety.

GOVERNMENT INTEREST STATEMENT

The research reported in this publication was supported by funding from King Abdullah University of Science and Technology (KAUST) Office of Sponsored Research (OSR) under Award No: OSR-2018-CARF/CCF-3079 and OSR-2015-CRG4-2572. This work was supported by the nSoft consortium.

BACKGROUND

Field of the Invention

The present disclosure relates generally to the development of sustainable energy sources. More particularly, the present disclosure relates to the efficient utilization of organic semiconductor nanoparticles (NPs) to produce hydrogen from water using visible light.

Background of the Invention

The development of sustainable energy sources is essential to avert impending climate change while sustaining the global population and economic growth.[1] Solar energy is by far one of the greatest available source of renewable energy, but its transience may limit its utility.[2] Thus, there is a need to harness solar energy is to provide power on a scale commensurate with or exceeding that currently generated from fossil fuels, it must be stored and supplied to users on demand.[2]

SUMMARY

According to first broad aspect, the present disclosure provides a nanoparticle comprising: an internal D/A heterojunction; the nanoparticle having a surface of PTB7-Th:EH-IDTBR decorated with a photodeposited Pt co-catalyst, wherein the nanoparticle comprises a HER rate of 64,426±7022 $\mu molh^{-1}g^{-1}$ at 10% Pt.

According to a second broad aspect, the present disclosure provides a nanoparticle comprising: an internal D/A heterojunction, wherein the nanoparticle comprises a HER rate of 64,426±7022 $\mu molh^{-1}g^{-1}$ under broadband visible light illumination.

According to a third broad aspect, the present disclosure provides a semiconductor device comprising: nanoparticles having an internal D/A heterojunction; the nanoparticles having surfaces of PTB7-Th:EH-IDTBR decorated with a photodeposited Pt co-catalyst, wherein the nanoparticles comprises a HER rate of 64,426±7022 $\mu molh^{-1}$ $g^{-1}$ at 10% Pt.

According to a fourth broad aspect, the present disclosure provides a semiconductor device comprising: nanoparticles having an internal D/A heterojunction, wherein the nanoparticles comprise a HER rate of 64,426±7022 $\mu molh^{-1}g^{-1}$ under broadband visible light illumination.

According to a fifth broad aspect, the present disclosure provides a semiconductor device comprising: nanoparticles having an internal D/A heterojunction; the nanoparticles having surfaces of PTB7-Th:EH-IDTBR decorated with a photodeposited Pt co-catalyst, wherein the semiconductor device comprises an $H_2$ evolution rate of over 60,000 $\mu molh^{-1}g^{-1}$ under 350 to 800 nm illumination and external quantum efficiencies (EQEs) over 6% in a region of maximum solar photon flux.

According to a sixth broad aspect, the present disclosure provides a method of fabricating a nanoparticle comprising: preparing individual stock solutions of PTB7-TH and EH-IDTBR in chloroform; heating the individual stock solutions at approximately 80° C. to a complete dissolution; filtering the individual stock solutions; preparing a nanoparticle precursor solution from the filtered individual stock solutions by mixing the individual stock solutions in a ratio of 0-100% EH-IDTBR adding approximately 1-10 mL of the nanoparticle precursor solution to approximately 0.1-1 wt. % solution of surfactant (SDS or TEBS) in approximately 5-50 mL of water and mixing for approximately 15 min at approximately 40° C. to form a pre-emulsion; sonicating the pre-emulsion for approximately 5 min to form a mini-emulsion; heating the mini-emulsion at approximately 85° C. under a stream of air to remove the chloroform to thereby form a surfactant stabilized nanoparticle dispersion in water; and filtering the nanoparticle to remove any large aggregates or debris.

According to a seventh broad aspect, the present disclosure provides a method of fabricating a nanoparticle comprising: preparing individual stock solutions of PTB7-TH and EH-IDTBR in chloroform; heating the individual stock solutions to a complete dissolution; filtering the individual stock solutions; preparing a nanoparticle precursor solution from the filtered individual stock solutions by mixing the individual stock solutions in a ratio of 0-100% EH-IDTBR adding a portion of the nanoparticle precursor solution to a solution of surfactant (SDS or TEBS) in water and mixing to form a pre-emulsion; sonicating the pre-emulsion to form a mini-emulsion; heating the mini-emulsion to remove the chloroform to thereby form a surfactant stabilized nanoparticle dispersion; and filtering the nanoparticle.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

DETAILED DESCRIPTION OF THE INVENTION

Definitions

Figure 1:
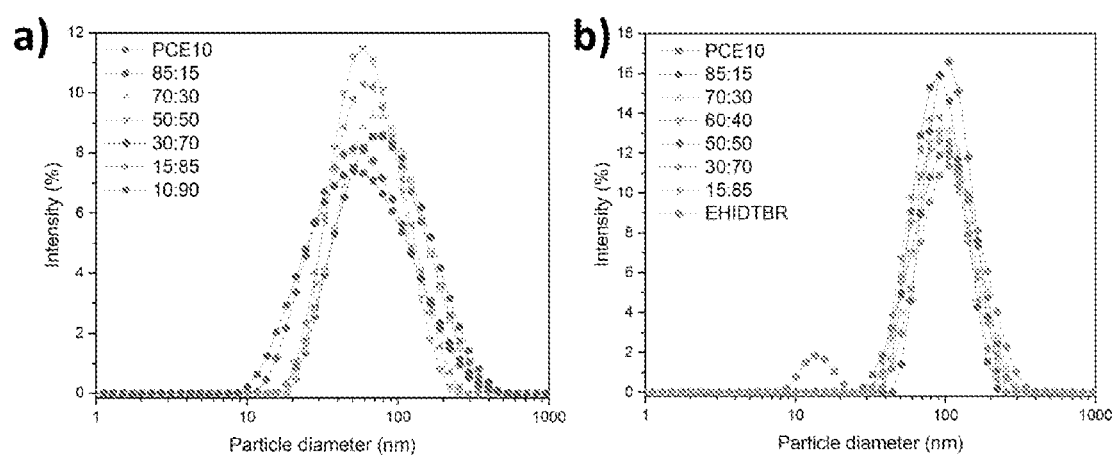
FIG. 1 is a graphical illustration of dynamic light scattering (DLS) size distributions by intensity of nanoparticles formed with SDS and TEBS according to one embodiment of the present disclosure.

Where the definition of terms departs from the commonly used meaning of the term, applicant intends to utilize the definitions provided below, unless specifically indicated.

It is to be understood that the foregoing general description and the following detailed description are exemplary and explanatory only and are not restrictive of any subject matter claimed. In this application, the use of the singular includes the plural unless specifically stated otherwise. It must be noted that, as used in the specification and the appended claims, the singular forms "a," "an" and "the" include plural referents unless the context clearly dictates otherwise. In this application, the use of "or" means "and/or" unless stated otherwise. Furthermore, use of the term "including" as well as other forms, such as "include", "includes," and "included," is not limiting.

For purposes of the present disclosure, the term "comprising", the term "having", the term "including," and variations of these words are intended to be open-ended and mean that there may be additional elements other than the listed elements.

For purposes of the present disclosure, directional terms such as "top," "bottom," "upper," "lower," "above," "below," "left," "right," "horizontal," "vertical," "up," "down," etc., are used merely for convenience in describing the various embodiments of the present disclosure. The embodiments of the present disclosure may be oriented in various ways. For example, the diagrams, apparatuses, etc., shown in the drawing figures may be flipped over, rotated by 90° in any direction, reversed, etc.

For purposes of the present disclosure, a value or property is "based" on a particular value, property, the satisfaction of a condition, or other factor, if that value is derived by performing a mathematical calculation or logical decision using that value, property or other factor.

For purposes of the present disclosure, it should be noted that to provide a more concise description, some of the quantitative expressions given herein are not qualified with the term "about." It is understood that whether the term "about" is used explicitly or not, every quantity given herein is meant to refer to the actual given value, and it is also meant to refer to the approximation to such given value that would reasonably be inferred based on the ordinary skill in the art, including approximations due to the experimental and/or measurement conditions for such given value.

For the purposes of the present disclosure, the term "atomic force microscopy (AFM)" refers to measuring the surface properties of a sample using an atomic force microscope; an instrument used for mapping the atomic-scale topography of a surface by means of the repulsive electronic forces between the surface and the tip of a microscope probe moving above the surface.

For the purposes of the present disclosure, the term "broadband visible light illumination" refers to a light spectrum that contains a broad range of wavelengths between 380-700 nm.

For the purposes of the present disclosure, the term "contact potential difference (CPD)" refers to . . . a electrostatic potential that exists between samples of two dissimilar electrically conductive materials (metals or semiconductors with different electron work functions) that have been brought into thermal equilibrium with each other, usually through a physical contact.

For the purposes of the present disclosure, the term "Cryo Transmission Electron Microscopy (cryoTEM)" refers to a method for imaging frozen-hydrated specimens at cryogenic temperatures by transmission electron microscopy. Specimens remain in their native state without the need for dyes or fixatives, allowing the study of fine cellular structures, viruses, protein complexes and organic nanoparticles at molecular resolution.

For the purposes of the present disclosure, the term "D/A combination" refers to any combination of an electron donor (D) semiconductor and an electron acceptor (A) semiconductor.

For the purposes of the present disclosure, the term "donor/acceptor (D/A) semiconductor heterojunction" refers to a heterojunction is an interface that occurs between two layers or regions of dissimilar semiconductors. A D/A heterojunction is a heterojunction formed between an electron donor (D) semiconductor and an electron acceptor (A) semiconductor. This type of heterojunction has a type II staggered gap energy level offset.

For the purposes of the present disclosure, the term "dynamic light scattering" refers to a technique used to measure particle size in suspensions by measuring the random changes in the intensity of light scattered from a suspension or solution. This technique is commonly known as dynamic light scattering (DLS), but is also called photon correlation spectroscopy (PCS) and quasi-elastic light scattering (QELS). The latter terms are more common in older literature.

For the purposes of the present disclosure, the term "external quantum efficiency (EQE)" refers to the number of electrons that have successfully reacted to form $H_2$ per photon incident on the photocatalyst at a specified photon energy.

For the purposes of the present disclosure, the term "$H_2$ evolution rate" refers to $H_2$ Evolution Rate (HER): the number of molecules of $H_2$ produced from the photocatalyst suspension per unit time.

For the purposes of the present disclosure, the term "hydrogen evolution reaction (HER)" refers to the electrochemical half-reaction $2H^+ + 2e^- \rightarrow H_2$ For the purposes of the present disclosure, the term "HER rate increase" refers to an increase in the $H_2$ Evolution Rate (HER)

For the purposes of the present disclosure, the term "heterojunction" refers to the interface that occurs between two layers or regions of dissimilar semiconductors. These semiconducting materials have unequal band gaps as opposed to a homojunction. It is often advantageous to engineer the electronic energy bands in many solid-state device applications, including semiconductor lasers, solar cells and transistors ("heterotransistors") to name a few. A definition of heterojunction may also include the interface between any two materials, including crystalline and amorphous structures of metallic, insulating, fast ion conductor and semiconducting materials.

For the purposes of the present disclosure, the term "heterostructure" refers to a multi-layer structure (at least two layers) wherein more than one material is used. Typically, different layers have different bandgaps and offsets. Layers can be lattice matched, strained, or metamorphically grown.

For the purposes of the present disclosure, the term "hydrogen evolution" refers to the production of hydrogen from a photocatalyst suspension.

For the purposes of the present disclosure, the term "hydrogen evolution photocatalysts" refers to a photocatalyst that produces hydrogen.

For the purposes of the present disclosure, the term "inorganic $H_2$ evolution photocatalyst (HEP)" refers to a photocatalyst that produces hydrogen fabricated from one or more inorganic semiconductors.

For the purposes of the present disclosure, the term "Kelvin probe force microscopy (KPFM)" refers to Kelvin probe force microscopy, also known as surface potential microscopy, is a noncontact variant of atomic force microscopy. By raster scanning in the x, y plane the work function of the sample can be locally mapped for correlation with sample features.

For the purposes of the present disclosure, the term "maximum solar photon flux" refers to the wavelength range of the solar spectrum with the highest number of photons per second per unit area.

For the purposes of the present disclosure, the term "miniemulsion process" refers to a nanoparticle fabrication process in which nanoparticles are formed from a surfactant stabilized emulsion of a solution of nanoparticle precursors (in this case organic semiconductors) dissolved in an organic solvent in an aqueous phase.

For the purposes of the present disclosure, the term "nanomorphology" refers to a particular form, shape, or structure For the purposes of the present disclosure, the term "overall water splitting (OWS)" refers to a process in which both the HER and the OER occur to split water into $H_2$ and $O_2$ $2H_2O \rightarrow 2H_2 + O_2$ For the purposes of the present disclosure, the term "oxygen evolution reaction (OER)" refers to the electrochemical half-reaction $2H_2O \rightarrow O_2 + 4(H^+ + e^-)$.

For the purposes of the present disclosure, the term "particulate" refers to matter in the form of minute separate particles.

For the purposes of the present disclosure, the term "particulate system" refers to a system in which photocatalysts in the form of minute separate particles are used to drive reactions.

For the purposes of the present disclosure, the term "particulate photocatalysts" refers to a photocatalyst that has the form of a minute particle (1 nm-1 mm diameter).

For the purposes of the present disclosure, the term "photocatalysts" refers to a material which absorbs light to bring it to higher energy level and provides such energy to a reacting substance to make a chemical reaction occur.

For the purposes of the present disclosure, the term "Pt loading" refers to attaching platinum (Pt) to the surface of a material.

For the purposes of the present disclosure, the term "semiconductor" or "semiconductor device" refers to an electronic component that exploits the electronic properties of semiconductor material, principally silicon, germanium, and gallium arsenide, as well as organic semiconductors. Semiconductor devices have replaced thermionic devices (vacuum tubes) in most applications. They use electronic conduction in the solid state as opposed to the gaseous state or thermionic emission in a high vacuum. Semiconductor devices may be manufactured both as single discrete devices and as integrated circuits (ICs), of devices manufactured and interconnected on a single semiconductor substrate, or wafer. Semiconductor material behavior can be easily manipulated by the addition of impurities, known as doping. Semiconductor conductivity can be controlled by the introduction of an electric or magnetic field, by exposure to light or heat, or by the mechanical deformation of a doped monocrystalline grid. Current conduction in a semiconductor occurs via mobile or "free" electrons and holes, collectively known as charge carriers. Doping a semiconductor such as silicon with a small proportion of an atomic impurity, such as phosphorus or boron, greatly increases the number of free electrons or holes within the semiconductor. When a doped semiconductor contains excess holes it is called "p-type," and when it contains excess free electrons it is known as "n-type," where p (positive for holes) or n (negative for electrons) is the sign of the charge of the majority mobile charge carriers. The semiconductor material used in devices is doped under highly controlled conditions in a fabrication facility, or fab, to control precisely the location and concentration of p- and n-type dopants. The junctions which form where n-type and p-type semiconductors join together are called p-n junctions. A semiconductor device works by controlling an electric current consisting of electrons or holes moving within a solid crystalline piece of semiconducting material such as silicon.

For the purposes of the present disclosure, the term "single photocatalyst" refers to one type of photocatalyst formed from a specific material or combination of materials, not two or more different photocatalysts.

For the purposes of the present disclosure, the term "small-angle neutron scattering" refers to small-angle neutron scattering which may include an experimental technique that uses elastic neutron scattering at small scattering angles to investigate the structure of various substances at a mesoscopic scale of about 1-100 nm.

For the purposes of the present disclosure, the term "sodium dodecyl sulfate (SDS)" refers to the substance sodium dodecyl sulfate, a common anionic surfactant.

For the purposes of the present disclosure, the term "sodium 2-(3-thienyl)ethyloxybutylsulfonate (TEBS)" refers to the substance sodium 2-(3-thienyl)ethyloxybutylsulfonate, a surfactant.

For the purposes of the present disclosure, the term "sodium poly[2-(3-thienyl)-ethoxy-4-butylsulfonate] (PTEBS)" refers to a water soluble, environmentally friendly conjugated polythiophene effective for enhancing the performance of hybrid solar cells. Absorption spectrum of the PTEBS may be tuned by acid doping. When PTEBS is acidified, self doping may occur and leads to optical and infrared absorption changes with increased conductivity. The new absorption bands in return may improve efficiencies for photovoltaic device performance. PTEBS may also be employed as a cathode interfacial material for perovskite solar cells. Ultrathin coating of PTEBs may lead to effective energy level aligning with improved film morphology. With a better ohmic contact between the perovskite layer and the cathode, device charge extraction and transport may be enhanced.

For the purposes of the present disclosure, the term "turnover frequency" refers to the number of moles of substrate (in this case H$^+$) that a mole of catalyst can convert to the desired product (in this case H$_2$) per unit time.

Description

While the invention is susceptible to various modifications and alternative forms, specific embodiment thereof has been shown by way of example in the drawings and will be described in detail below. It should be understood, however that it is not intended to limit the invention to the particular forms disclosed, but on the contrary, the invention is to cover all modifications, equivalents, and alternatives falling within the spirit and the scope of the invention.

The development of sustainable energy sources is essential to avert impending climate change while sustaining the global population and economic growth.[1] Solar energy is by far the greatest available source of renewable energy, but its transience limits its utility.[2] If solar energy is to provide power on a scale commensurate with or exceeding that currently generated from fossil fuels, it must be stored and supplied to users on demand.[2] Storing solar energy in the chemical bonds of a fuel is therefore highly desirable.[2] H$_2$ is the simplest such "solar fuel" and can be generated from water via electrolysis, or using semiconductor photocatalysts, which absorb light and convert it to electrical charges that drive surface redox reactions. A "particulate" system in which photocatalysts are directly dispersed in water is projected to be the cheapest way of producing solar H$_2$.[3] In the simplest case, overall water splitting (OWS) can be achieved by a single photocatalyst that simultaneously oxidises and reduces H$_2$O into H$_2$ and O$_2$. However, the only particulate photocatalysts currently capable of driving OWS are typically based on single component, wide bandgap semiconductors such as TiO$_2$,[4] SrTiO$_3$,[5] or carbon nitrides (CNx)[6,7], which are almost exclusively active at UV wavelengths that constitute <4% of the solar spectrum.[8] This fundamentally limits their maximum solar to hydrogen efficiency ($\eta$STH) below the target of 10% deemed necessary for commercial viability.[3,8] OWS can also be achieved by two photocatalysts operating in parallel, where the hydrogen evolution reaction (HER) and oxygen evolution reaction (OER) take place on separate semiconductors. This "Z-scheme" system is analogous to natural photosynthesis, and can potentially achieve higher $\eta$STH by employing semiconductors with narrower bandgaps which can absorb a larger proportion of the solar spectrum.[9] Stable, low cost and efficient O$_2$ evolution photocatalysts, such as WO$_3$[10] and BiVO$_4$,[11] are active up to 470 and 510 nm respectively,[12] but the development of stable, efficient and low cost inorganic H$_2$ evolution photocatalysts (HEPs) has proved more challenging, particularly for HEPs which exhibit complementary absorptions and high activities above 500 nm.[13-15] This greatly limits the $\eta$STH of current Z-schemes and has prompted the recent interest in developing visible light active HEPs based on organic semiconductors other than CN$_x$,[7] whose bandgaps can be tuned to absorb further into the visible spectrum. Conjugated polymers[16,17] and covalent organic frameworks (COFs)[18] have attracted the most attention due to their modular structures which enable their energy levels and physical properties to be precisely controlled. However, the external quantum efficiencies (EQEs) of these novel non-CN$_x$ photocatalysts have been limited by the high exciton binding energies and short exciton diffusion lengths (typically 5-10 nm)[19] of organic semiconductors which cause high rates of exciton recombination in the semiconductor bulk,[20] and hence inefficient generation of charges that can drive redox reactions at the photocatalyst surface. To overcome this limitation, most research has been focused on improving exciton dissociation at the photocatalyst surface by increasing the semiconductor/electrolyte interfacial area via nanoparticle (NP) formation, hydrophilicity enhancements and/or by sensitizing the photocatalyst surface with a suitable dye to create a donor/acceptor (D/A) semiconductor heterojunction that is able to dissociate excitons at the external photocatalyst/dye interface.[21,22] Less attention has been given to developing organic non-CN$_x$ HEPs with internal semiconductor heterojunctions that can drive exciton dissociation and spatially separate charges in the photocatalyst bulk.[17,23] Conjugated polymer NPs can be readily fabricated with an internal D/A heterojunction by blending donor and acceptor semiconductors together within the same NP.[24] However, this feature has not yet been fully exploited, with most studies to date focusing on optimizing the photocatalytic performance of HEP NPs formed of a single conjugated polymer.[25-27]

Thus, photocatalysts formed from a single organic semiconductor typically suffer from inefficient intrinsic charge generation, which leads to low photocatalytic activities. Disclosed embodiments demonstrate that incorporating a heterojunction between a donor polymer (PTB7-Th) and non-fullerene acceptor (EH-IDTBR) in organic nanoparticles (NP) can result in hydrogen evolution photocatalysts with greatly enhanced photocatalytic activity. Control of the nanomorphology of these NPs was achieved by varying the stabilizing surfactant employed during NP fabrication, converting it from a core-shell structure to an intermixed donor/acceptor blend, and increasing $H_2$ evolution by an order of magnitude. The resulting photocatalysts display an unprecedentedly high $H_2$ evolution rate of over 60,000 $\mu mol h^{-1} g^{-1}$ under 350 to 800 nm illumination and external quantum efficiencies (EQEs) over 6% in the region of maximum solar photon flux.

Disclosed embodiments also detail the development of novel organic semiconductor NP HEPs which incorporate an internal D/A heterojunction that enhances exciton dissociation in the NP bulk, leading to greatly enhanced photocatalytic activity, compared to single component NPs. By selecting an appropriate stabilizing surfactant employed during NP fabrication, it was possible to optimize the heterojunction morphology from the common, but unfavorable, core-shell structure to a more intimately mixed blend, where both donor and acceptor components are present at the NP surface. This dramatically improved charge extraction from the NPs and resulted in stable (35 h) H2 evolution photocatalysts with unprecedentedly high activity under broadband visible light illumination, and EQEs exceeding 5% at 660 to 700 nm. These are the highest EQEs at wavelengths >500 nm reported for any organic HEP to date, and may provide a pathway to high efficiency solar to chemical energy conversion by substantially improving the ηSTH of current Z-schemes.

Disclosed embodiments include NPs fabricated via the miniemulsion process,[29] initially employing sodium dodecyl sulfate (SDS) as the stabilising surfactant, from the donor polymer Poly([2,6'-4,8-di(5-ethylhexylthienyl)benzo[1,2-b;3,3-b]dithiophene]{3-fluoro-2[(2-ethylhexyl)carbonyl]thieno[3,4-b]thiophenediyl}) (PTB7-Th) matched with the nonfullerene acceptor EH-IDTBR. FIG. 1 is a graphical illustration of dynamic light scattering (DLS) size distributions by intensity of nanoparticles formed with a range of PTB7-TH/EH-IDTBR ratios. Nanoparticles may be formed with (a) SDS (b) TEBS. The NP size distributions may be measured by dynamic light scattering (DLS) (FIG. 1 and as provided by Table 1).

TABLE 1

| DLS parameters | | |
|---|---|---|
| | Zavg.D (nm) | PdI |
| SDS | | |
| PTB7-TH | 67.1 | 0.285 |
| 85/15 | 68.2 | 0.262 |
| 70/30 | 63.4 | 0.298 |

TABLE 1-continued

| DLS parameters | | |
|---|---|---|
| | Zavg.D (nm) | PdI |
| 50/50 | 50.5 | 0.282 |
| 30/70 | 46.9 | 0.271 |
| 15/85 | 50.5 | 0.282 |
| 10_90 | 45.2 | 0.293 |
| TEBS | | |
| PTB7-TH | 83.3 | 0.201 |
| 85/15 | 84.1 | 0.164 |
| 70/30 | 82.6 | 0.229 |
| 60/40 | 80.6 | 0.196 |
| 50/50 | 78.7 | 0.221 |
| 30/70 | 81.9 | 0.228 |
| 15/85 | 81.4 | 0.234 |
| EH-IDTBR | 63.8 | 0.263 |

Figure 2:
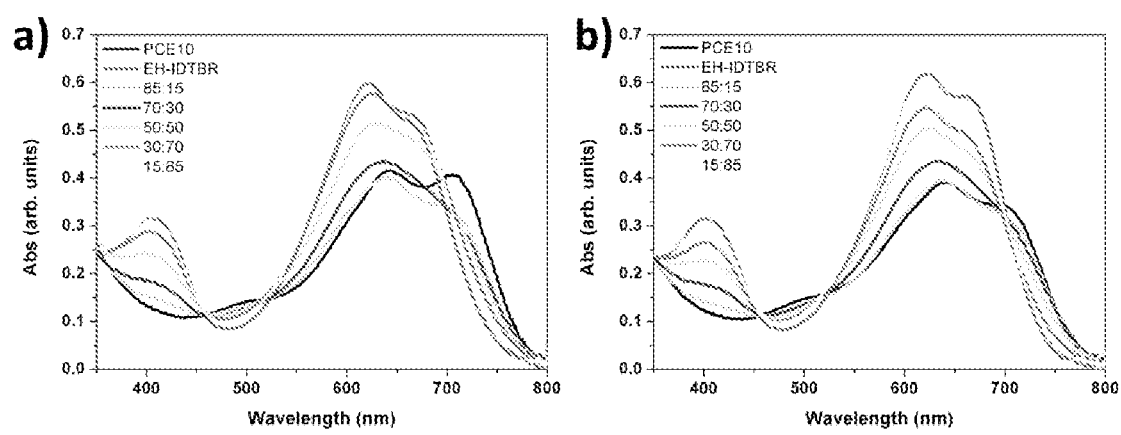
FIG. 2 is a graphical illustration of absorption spectra of PTB7-TH:EH-IDTBR nanoparticles (NPs) at different PTB7-TH:EH-IDTBR ratios formed with TEBS and SDS according to one embodiment of the present disclosure.
Figure 3:
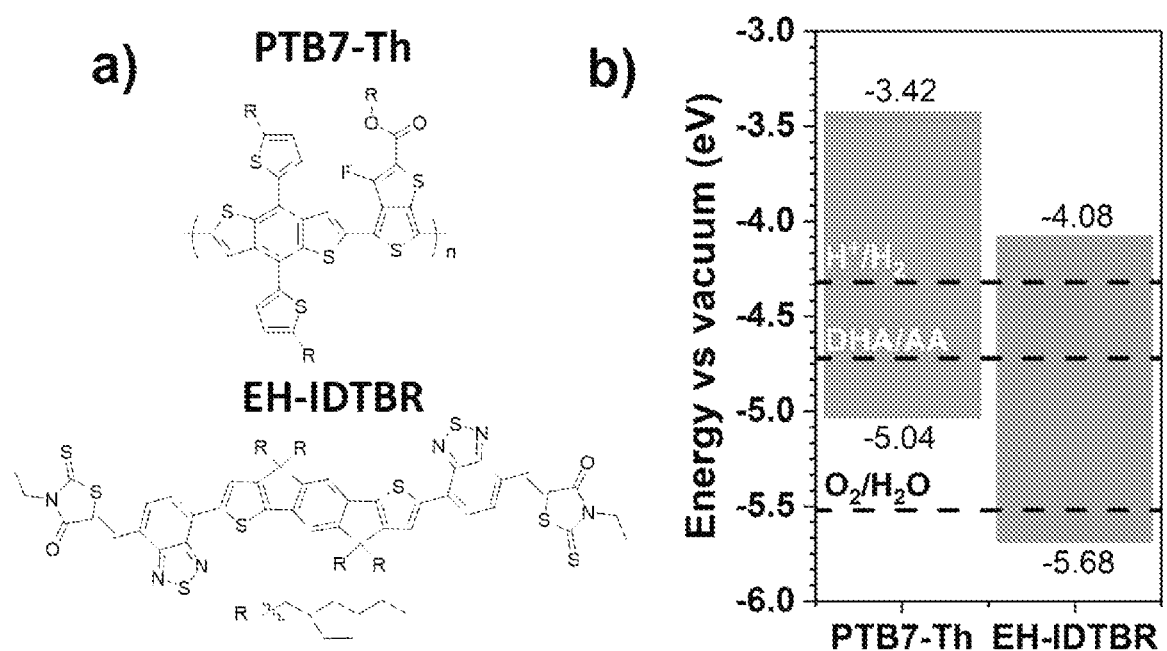
FIG. 3 illustrates chemical structures and energy levels of PTB7-Th and EH-IDTBR according to one embodiment of the present disclosure.

FIG. 2 is a graphical illustration of absorption spectra of PTB7-TH:EH-IDTBR nanoparticles (NPs) at different PTB7-TH:EH-IDTBR ratios formed with TEBS (a) and SDS (b). FIG. 3 illustrates materials and energy levels including: a) Chemical structures of PTB7-Th and EH-IDTBR. b) Highest occupied and lowest unoccupied molecular orbital energy levels of PTB7-Th and EH-IDTBR compared to the proton reduction potential ($H^+/H_2$), water oxidation potential ($O_2/H_2O$), and the calculated potential of the two hole oxidation of ascorbic acid to dehydroascorbic acid in solution (DHA/AA)[21] at pH 2 (the experimentally measured pH of 0.2 mol/L ascorbic acid). All energy levels and electrochemical potentials are expressed on the absolute electrochemical scale (0 V vs. SHE=-4.44 V vs Vac.).[28]

In one disclosed embodiment, the D/A combination was chosen for its strong visible light absorption (FIG. 2), type II energy level offset (FIG. 3), and interfacial morphology that drives efficient charge separation at the PTB7-Th/EH-IDTBR heterojunction[30] while also generating sufficiently reducing photoexcited electrons in the EH-IDTBR lowest unoccupied molecular orbital (LUMO) to drive the HER with the aid of a Pt co-catalyst as well as sufficiently oxidising holes in the PTB7-Th highest occupied molecular orbital (HOMO) to oxidise ascorbic acid. Pt was photodeposited in-situ on the organic NP surface during all $H_2$ evolution measurements.

Figure 4:
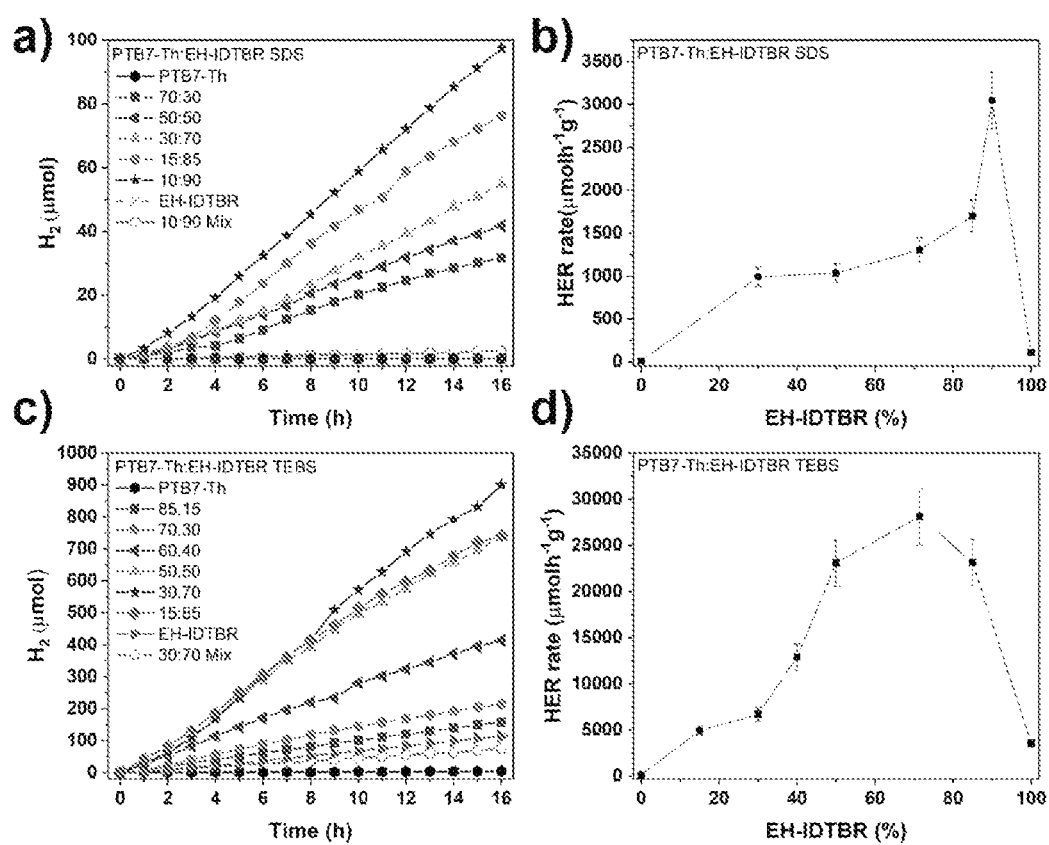
FIG. 4 is a graphical illustration of $H_2$ evolution from PTB7-Th/EH-IDTBR nanoparticles according to one embodiment of the present disclosure.

FIG. 4 illustrates $H_2$ evolution from PTB7-Th/EH-IDTBR nanoparticles. Sections (a,c) provide H2 evolution versus time from PTB7-Th/EH-IDTBR nanoparticles formed from a range of PTB7-Th:EH-IDTBR ratios using SDS (a) and TEBS (c) surfactant. Sections (b,d) provide average $H_2$ evolution rates of PTB7-Th/EH-IDTBR nanoparticles formed using SDS (b) and TEBS (d) surfactant over 16 h as a function of blend composition. Conditions may include: 2 mg PTB7-Th/EH-IDTBR nanoparticles, 0.2 mol 1-1 ascorbic acid (20 ml), pH 2, 5% (10 μg) Pt, 300 W Xe lamp (350 to 800 nm), 16 $cm^2$ reactor. Error bars may be calculated as a percentage uncertainty on the basis of six repeat measurements.

Figure 5:
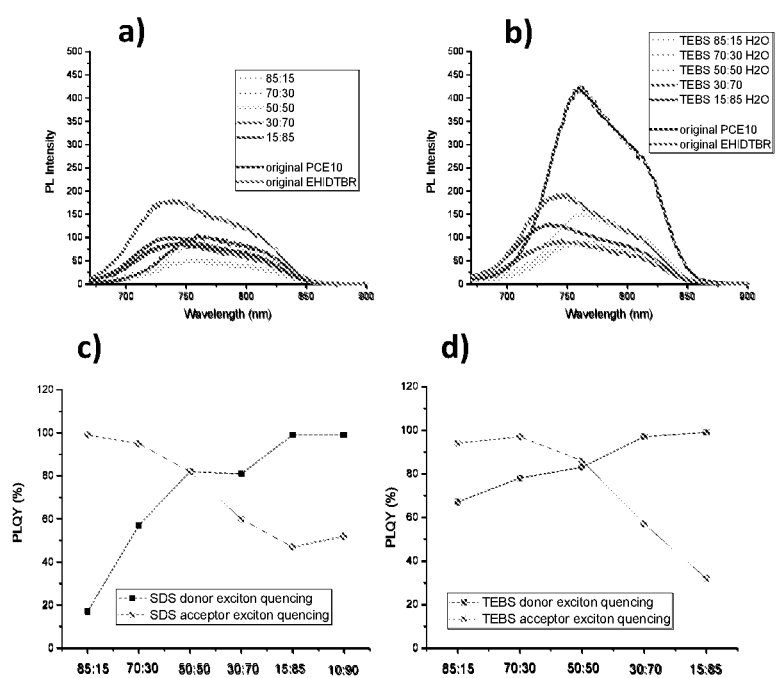
FIG. 5 is a graphical illustration of photoluminescence spectra of PTB7-TH:EH-IDTBR nanoparticles at various blend ratios formed with SDS and TEBS surfactants according to one embodiment of the present disclosure.

Measuring the HER rates of NPs composed of a range of PTB7-Th:EH-IDTBR mass ratios formed using SDS (FIG. 4, (a-b)) revealed that all D/A NPs formed from a PTB7-Th:EH-IDTBR blend were significantly more active than single component NPs formed of either pristine PTB7-Th, pristine EH-IDTBR, or both pristine NPs mixed together. The HER rate increase is therefore attributed to enhanced charge generation in the blend NPs driven by their internal D/A heterojunction. This is confirmed by photoluminescence quenching yield (PLQY) measurements, which show partial quenching of both PTB7-Th and EH-IDTBR excitons for all two component NP blend compositions (see FIG. 5). FIG. 5 provides photoluminescence spectra of PTB7-TH:EH-IDTBR nanoparticles at various blend ratios formed with (a) SDS (b) TEBS surfactants. Photoluminescence quenching yields of PTB7-TH (donor) and EH-IDTBR (acceptor) in PTB7-TH:EH-IDTBR blend NPs formed with (c) SDS (d) TEBS surfactants as a function of blend composition. Interestingly, the maximum HER rate (3044±332 $\mu$molh$^{-1}$g$^{-1}$) occurred at a blend ratio (EH-IDTBR mass fraction of 90%) where there is insufficient PTB7-Th to efficiently quench all excitons generated in EH-IDTBR, as indicated by the relatively low EH-IDTBR PLQY (52%, FIG. 5). Disclosed embodiments attributed the suppressed HER rates at <90% EH-IDTBR to a core-shell NP morphology as indicated from our structural analyses detailed below. This morphology would allow exciton dissociation at the PTB7-Th/EH-IDTBR heterojunction, but would subsequently confine most photogenerated electrons to the EH-IDTBR core, preventing efficient electron extraction to the Pt cocatalyst at the NP surface, leading to low photocatalytic activity. Increasing the EH-IDTBR fraction increases the probability of NPs having a partially exposed EH-IDTBR core onto which Pt can be deposited, which improves electron extraction from the NP. This gradually increases the HER rate until the EH-IDTBR mass fraction exceeds a threshold value between 85-90% at which point PTB7-Th can no longer fully encapsulate the EH-IDTBR core; allowing more efficient extraction of both electrons from EH-IDTBR and holes from PTB7-Th, and leading to the maximum HER rate at 90% EH-IDTBR.

Figure 6:
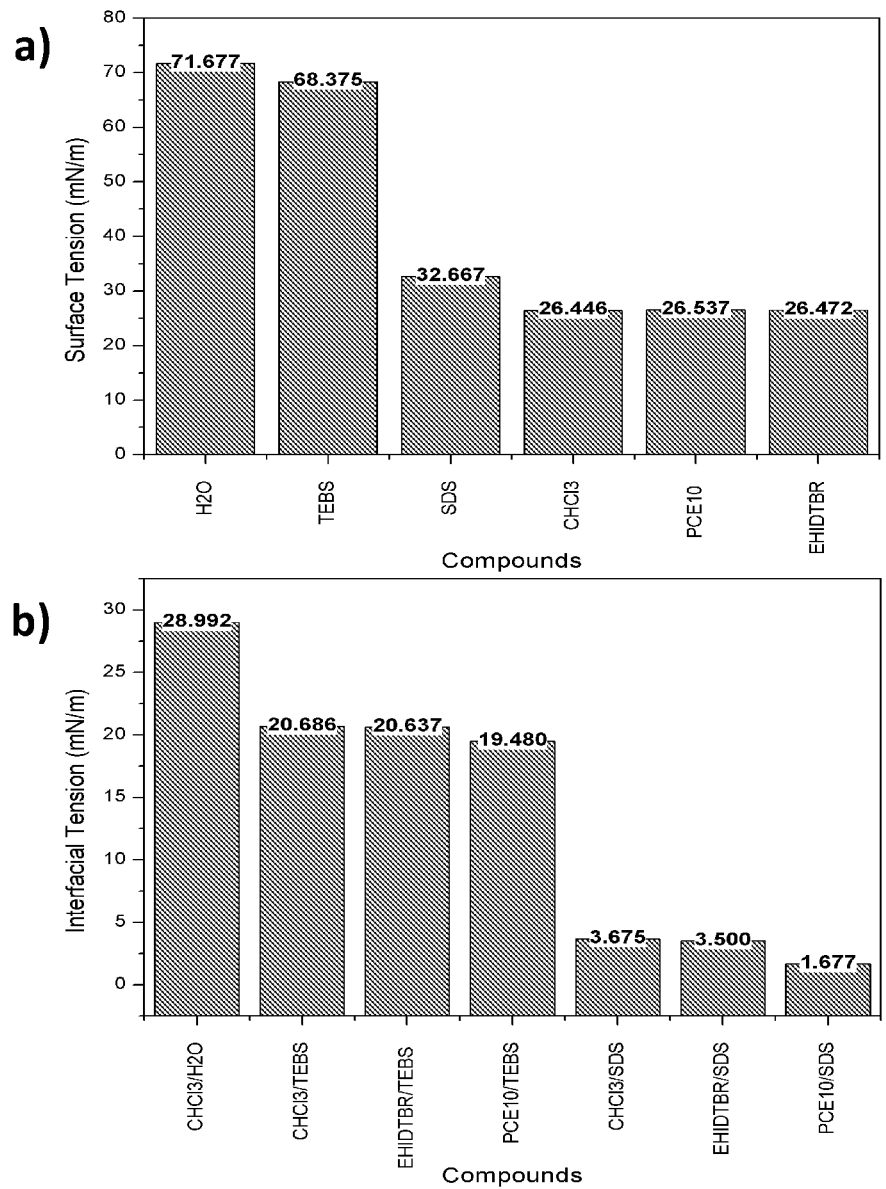
FIG. 6 is a graphical illustration of surface tensions and interfacial tensions measured using the ring method according to one embodiment of the present disclosure.

Core/shell morphologies are common in polymer/small molecule blend nanoparticles prepared from miniemulsions stabilised by SDS.[31-33] This morphology occurs, because as the organic solvent is removed, the low volatility components phase segregate to minimize interfacial tension between one another and between the continuous and disperse phases of the emulsion.[34] The chloroform/water interfacial tension in the presence of SDS was twice as high when the chloroform phase contained EH-IDTBR vs. PTB7-Th (FIG. 6).

FIG. 6 illustrates a) surface tensions b) interfacial tensions measured using the ring method. In some embodiments, PTB7-Th (PTB7-TH) and EH-IDTBR may be dissolved in the chloroform phase. SDS and TEBS may be dissolved in the water phase. Therefore, when forming NPs from a mixed PTB7-Th:EH-IDTBR solution, it is thermodynamically favorable for PTB7-Th to segregate to the surface of the emulsified chloroform droplets in order to minimise their surface tension; eventually forming NPs with a PTB7-Th rich shell and an EH-IDTBR rich core. In accordance with disclosed embodiments, the difference in interfacial tensions is attributed to a greater affinity between the long aliphatic tail of SDS and the higher alkyl chain density of PTB7-Th compared to EH-IDTBR. Correspondingly, a surfactant with a short aromatic tail, such as sodium 2-(3-thienyl)ethyloxybutylsulfonate (TEBS)[35] was expected to have increased affinity for EH-IDTBR because it can interact more strongly with its exposed aromatic units. In the presence of TEBS, the chloroform/water interfacial tensions were almost identical when the chloroform phase contained EH-IDTBR vs. PTB7-Th (FIG. 6). Because the affinity of TEBS for PTB7-Th and EH-IDTBR is approximately equal, radial segregation of PTB7-Th or EH-IDTBR within the NP is no longer thermodynamically favored. Consequently, when TEBS is employed as the stabilising surfactant, PTB7-Th and EH-IDTBR are expected to be more homogenously mixed throughout the NP and to reside at its surface in approximately equal proportions; providing pathways for efficient extraction of both electrons and holes, thereby increasing the HER rate. Employing TEBS during NP formation dramatically enhanced the HER rates of the blend NPs at all PTB7-Th:EH-IDTBR ratios (FIG. 4 (*b-c*)), with the maximum HER rate (28,133±3067 $\mu$molh$^{-1}$g$^{-1}$) increasing by almost an order of magnitude compared to NPs formed using SDS. The optimum blend composition also shifted from an EH-IDTBR mass fraction of 90% to 70%; a composition in which there is more efficient exciton dissociation, as evidenced by PL quenching (FIG. 5), and which has been previously reported to deliver optimal photon conversion efficiency in the active layer of solar cells.[36] FIG. 7 graphically illustrates H2 evolution vs. time of P3HT:PCBM 1:1 NPs formed using (a) SDS (b) TEBS surfactants. An even greater increase in the relative HER rate upon replacing SDS with TEBS as the stabilising surfactant may be observed for P3HT:PCBM NPs (FIG. 7), which highlights the broad applicability of this technique for optimizing the morphology of D/A NP photocatalysts formed from a wide range of solution processable semiconducting polymers and small molecules.

Figure 8:
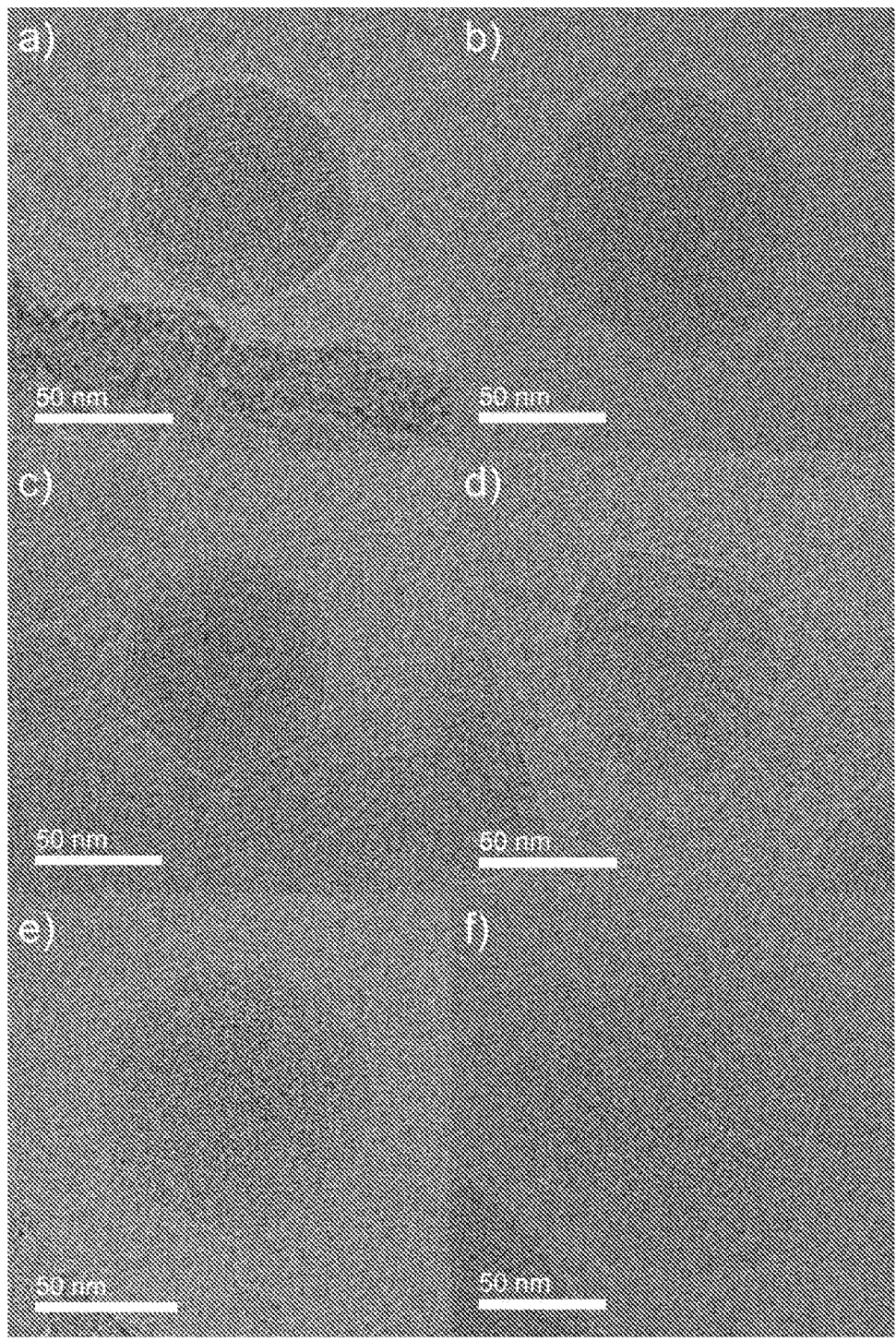
FIG. 8 illustrates bright-field cryo-TEM images of nanoparticle photocatalysts showing differences in internal nanoparticle morphology according to one embodiment of the present disclosure.
Figure 9:
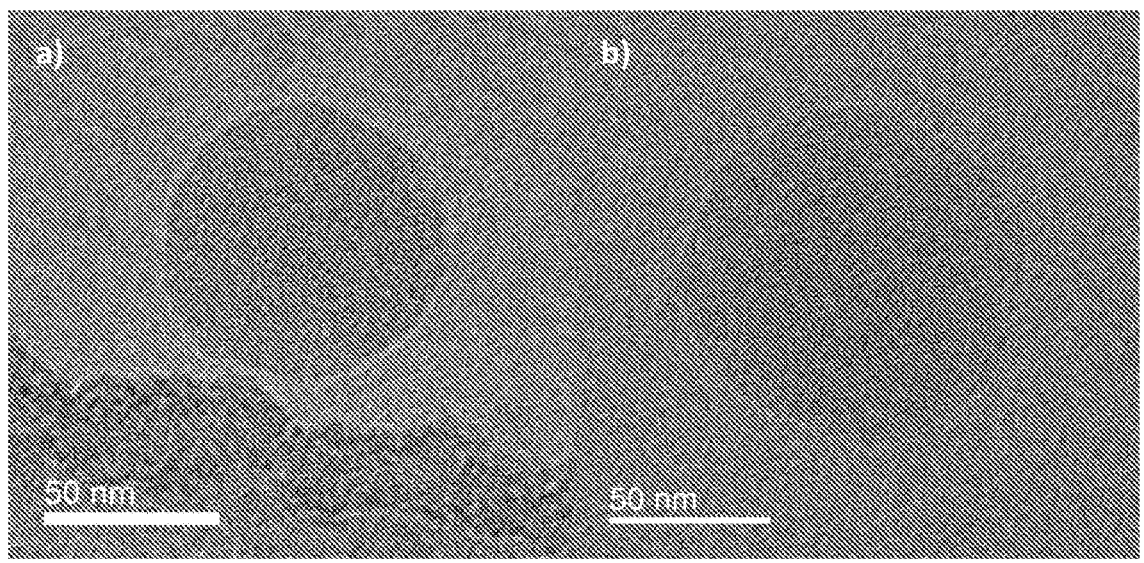
FIG. 9 illustrates high resolution cryo-TEM images of PTB7-Th (SDS) and PTB7-Th (TEBS) according to one embodiment of the present disclosure.

FIG. 8 provides bright-field cryo-TEM images of nanoparticle photocatalysts showing differences in internal nanoparticle morphology. a) PTB7-Th (SDS). b) PTB7-Th (TEBS). c) EH-IDTBR (SDS). d) EH-IDTBR (TEBS). e) PTB7-Th:EH-IDTBR 30:70 (SDS). f) PTB7-Th:EH-IDTBR 30:70 (TEBS). Note: the dark contrast at the bottom of images (a,c,e) of FIG. 8 arises from the carbon TEM grid. High-resolution images of (a-f) of FIG. 8 and detailed analysis of images (c-f) of FIG. 8 are submitted in FIGS. 9-15 as follows:

FIG. 9 illustrates high resolution cryo-TEM images of a) PTB7-7b (SDS) b) PTB7-Th (TEBS) according to one embodiment of the present disclosure.

Figure 10:
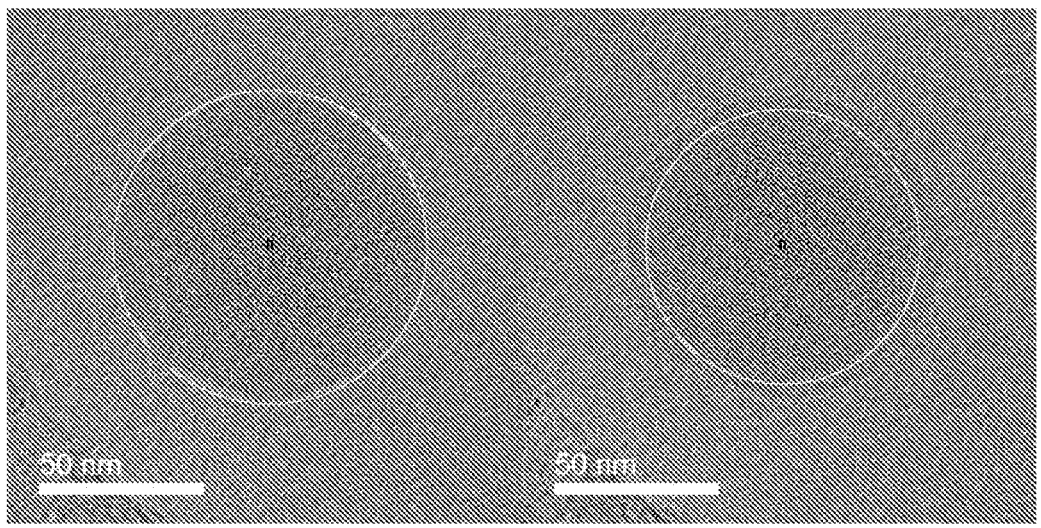
FIG. 10 shows a cryo TEM image analysis of 30:70 PTB7-TH:EH-IDTBR (SDS) according to one embodiment of the present disclosure.

FIG. 10 provides cryo TEM image analysis of 30:70 PTB7-TH:EH-IDTBR (SDS). Calculations are based on volumes, assuming a spherical particle and equal densities of PTB7-TH and EH-IDTBR.

Figure 11:
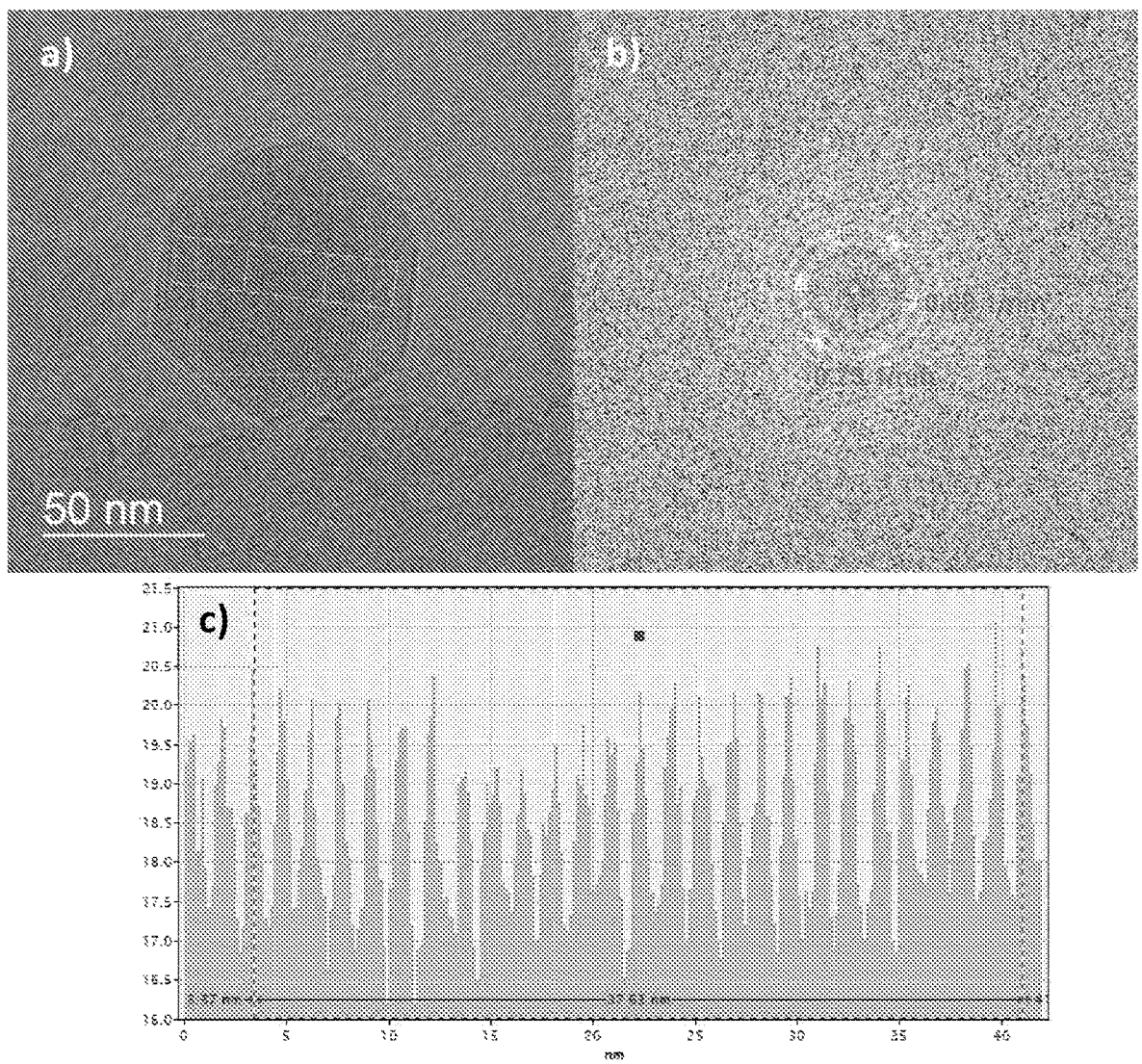
FIG. 11 provides a cryo TEM image analysis of EH-IDTBR (SDS) according to one embodiment of the present disclosure.

FIG. 11 provides illustrative cryo TEM image analysis of EH-IDTBR (SDS). Image (a) of FIG. 11 provides nanoparticle highlighting analysis areas. The area inside the red square is processed using fast fourier transform (FFT). The resulting reciprocal space image is shown in (b) of FIG. 11. The profile along the long axis of the area in the blue rectangle is shown in (c) of FIG. 11. Both FFT and profile results show a lattice spacing of 1.6 nm.

Figure 12:
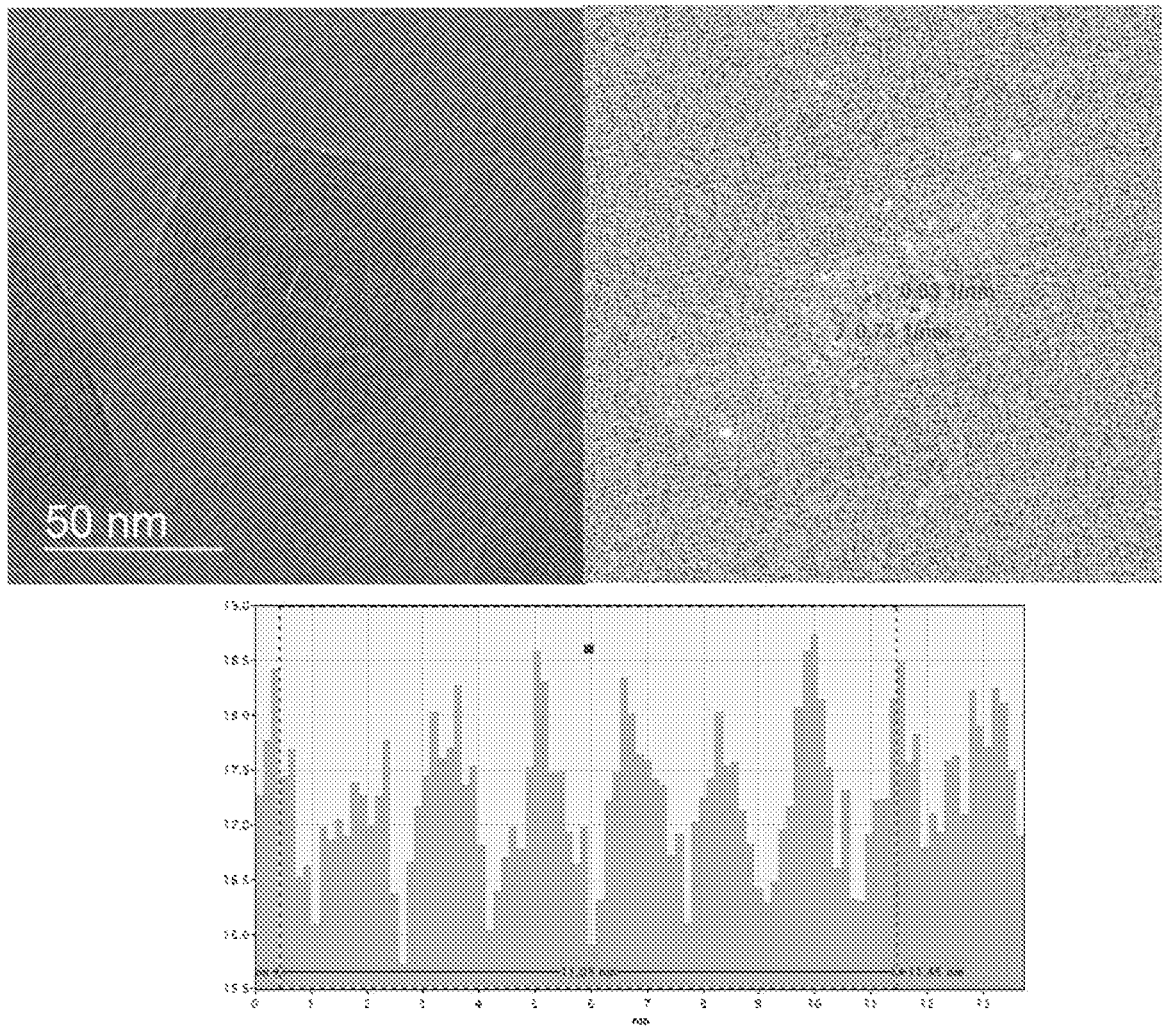
FIG. 12 provides a cryo TEM image analysis of EH-IDTBR (TEBS) according to one embodiment of the present disclosure.

FIG. 12 provides illustrative cryo TEM image analysis of EH-IDTBR (TEBS). Image (a) of FIG. 12 provides nanoparticle highlighting analysis areas. The area inside the red square is processed using fast fourier transform (FFT). The resulting reciprocal space image is shown in (b) of FIG. 12. The profile along the long axis of the area in the blue rectangle is shown in (c) of FIG. 12. Both FFT and profile results show a lattice spacing of 1.6 nm.

Figure 13:
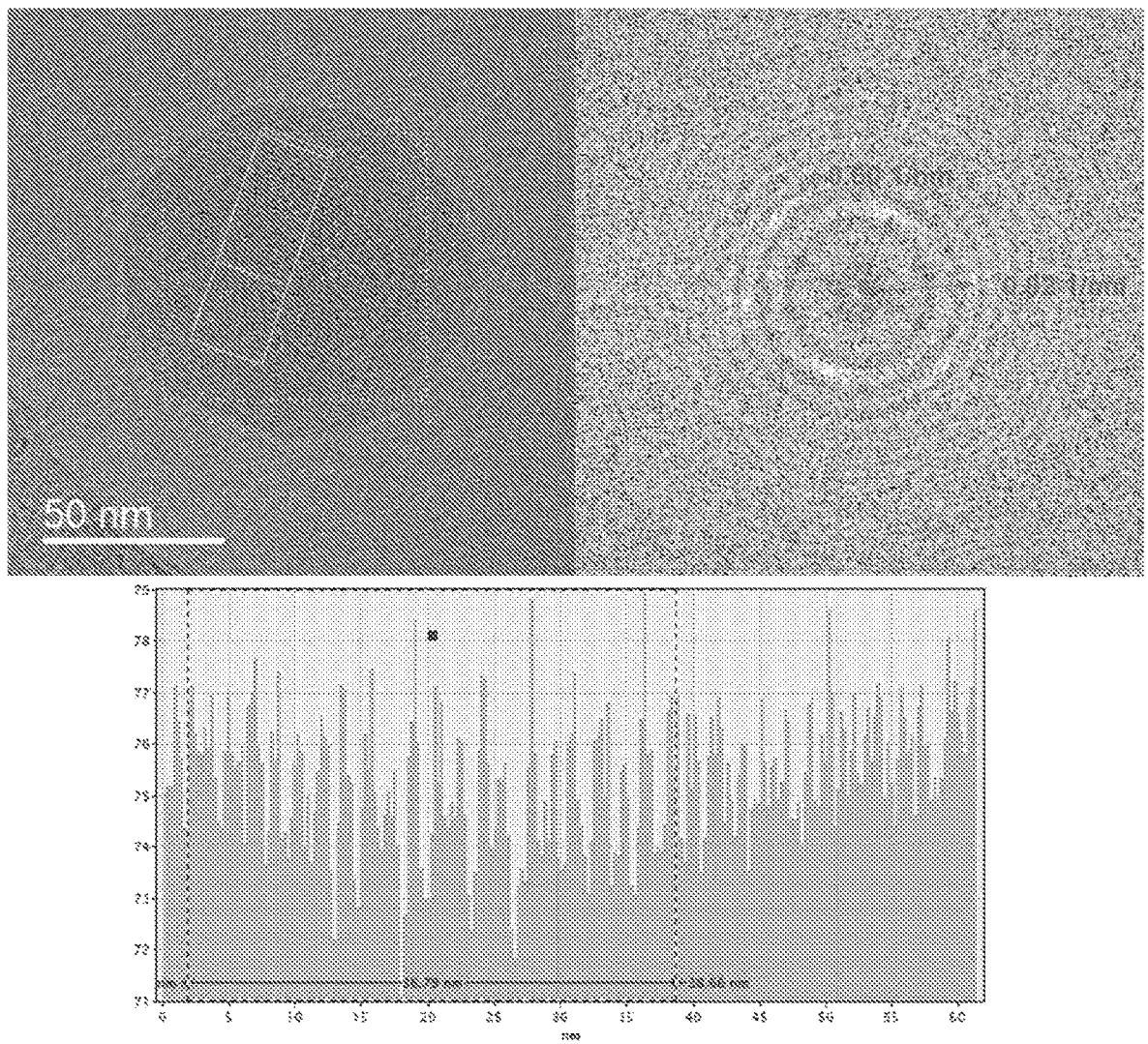
FIG. 13 provides a cryo TEM image analysis of 30:70 PTB7-TH:EH-IDTBR (SDS) according to one embodiment of the present disclosure.

FIG. 13 provides illustrative cryo TEM image analysis of 30:70 PTB7-TH:EH-IDTBR (SDS). Image (a) of FIG. 13 provides nanoparticle highlighting analysis areas. The area inside the red square is processed using fast fourier transform (FFT). The resulting reciprocal space image is shown in (b) of FIG. 13. The profile along the long axis of the area in the blue rectangle is shown in (c) of FIG. 13. Both FFT and profile results show a lattice spacing of 1.7 nm.

Figure 14:
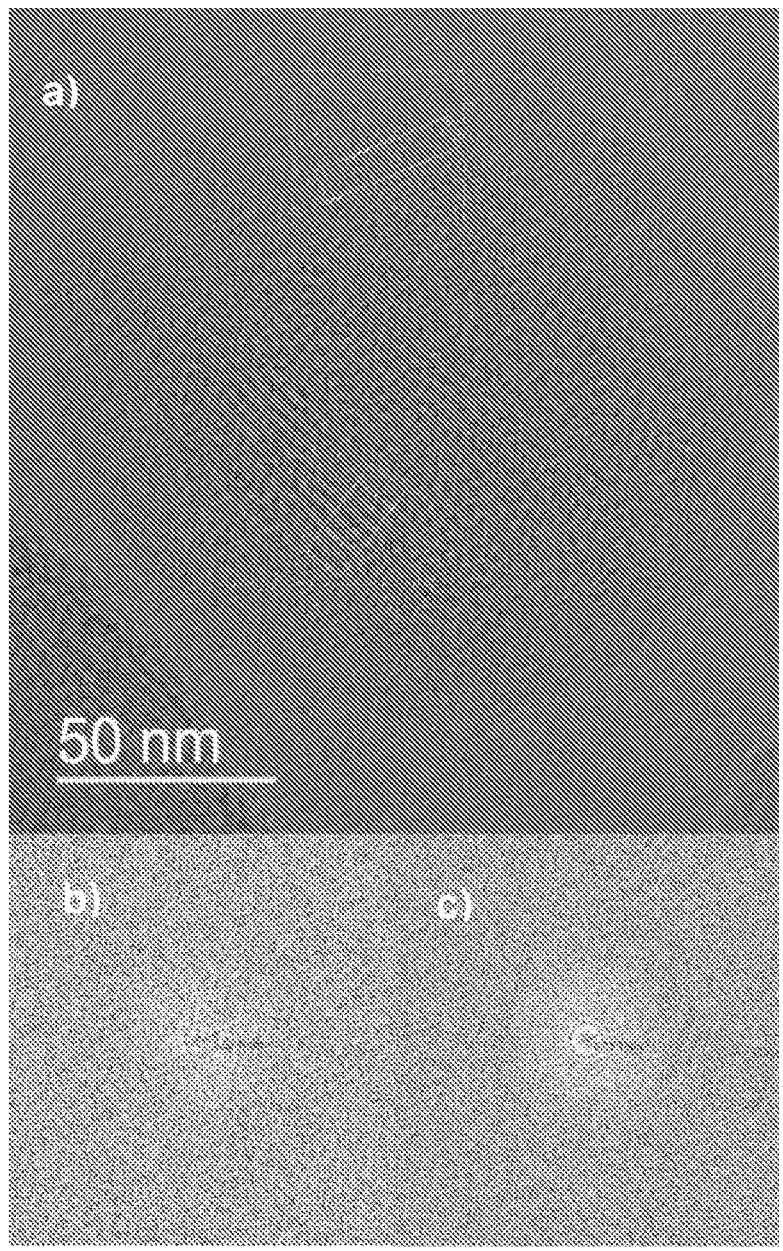
FIG. 14 provides a cryo TEM image analysis of 30:70 PTB7-TH:EH-IDTBR (TEBS) according to one embodiment of the present disclosure.
Figure 14:
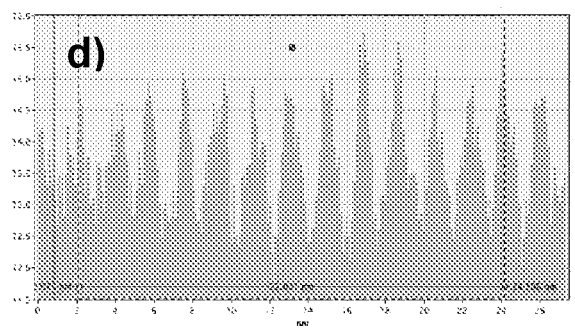
Figure 14:
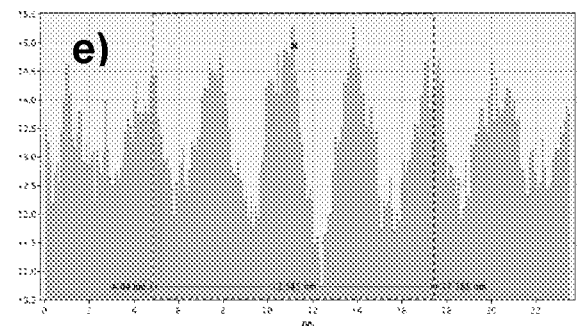

FIG. 14 provides illustrative cryo TEM image analysis of 30:70 PTB7-TH:EH-IDTBR (TEBS). Image (a) of FIG. 14 provides nanoparticle highlighting analysis areas. Image (b)

of FIG. 14 is processed using fast fourier transform (FFT) of the area in the upper red square. Image (c) of FIG. 14 is the FFT of the area inside the lower red square. Image (d) of FIG. 14 is a profile along the long axis of the area in the upper blue rectangle. Image (e) of FIG. 14 is a profile along the long axis of the area in the lower blue rectangle. FFT and profiles of FIG. 14 show a lattice spacing of 1.9 nm and 3.2 nm for the upper and lower regions respectively.

Figure 15:
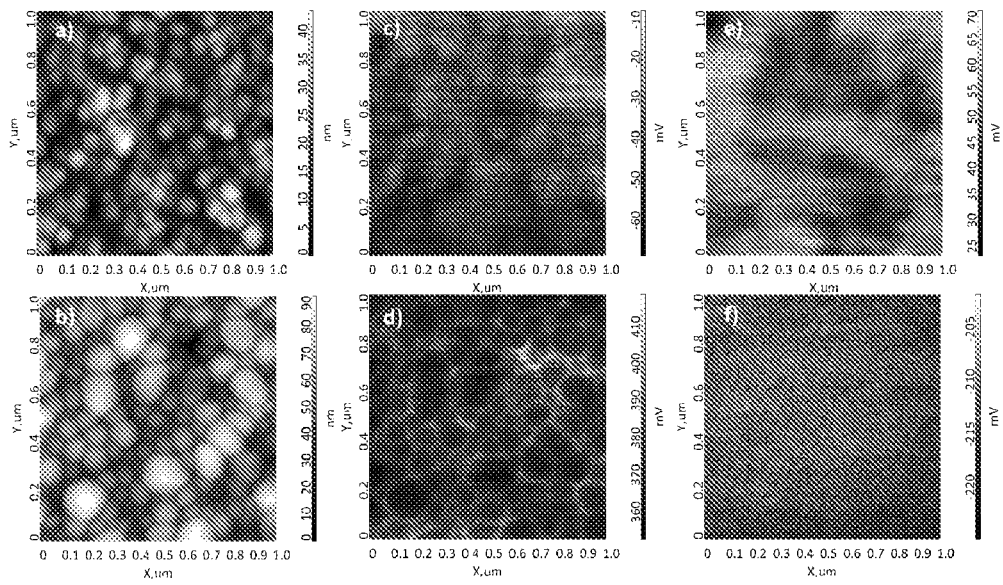
FIG. 15 is a graphical illustration of topography and contact potential difference (CPD) measured by Kelvin probe force microscopy (KPFM) according to one embodiment of the present disclosure.

FIG. 15 is a graphical illustration of topography (a-b) of FIG. 15 and contact potential difference (CPD) (c-f) of FIG. 15 measured by Kelvin probe force microscopy (KPFM). Images correspond to nanoparticles synthesised using either SDS (a, c) of FIG. 15 or TEBS (b, d) of FIG. 15. Gold (e) of FIG. 15 and ITO (f) of FIG. 15 may be used as the standard and reference, respectively. Mean VCPD for gold=+50 mV. Mean VCPD for ITO=−213 mV. The workfunction estimated from the mean surface potential was found to be larger for NPs formed using TEBS (5.43 eV—calculated from a mean surface potential of 378 mV) compared to NPs formed using SDS (5.01 eV—calculated from a mean surface potential of −41 mV). This suggests a more EH-IDTBR rich surface in the NPs formed using TEBS.

To confirm that the increased HER rates in NPs formed using TEBS are due to a transition from a core-shell to an intermixed NP morphology, the internal morphologies of PTB7-Th:EH-IDTBR NPs fabricated using TEBS and SDS were analysed by cryo-transmission electron microscopy (TEM, FIG. 8). This technique may be selected, because it can image the NPs in an environment that is close to their native state, and therefore sample preparation is expected to preserve their morphology. Single component PTB7-Th NPs formed using SDS or TEBS ((a-b) of FIG. 8) are both amorphous, as indicated by the round NP shape and relatively featureless nanoparticle projection which suggests that there is little structural order in the polymer microstructure. Single component EH-IDTBR NPs formed using SDS and TEBS ((c-d) of FIG. 8) both had highly crystalline structures with a lattice spacing of 1.6 nm, clearly visible as lines of alternating high and low electron density. This spacing is consistent with the diffraction peak at 0.39 Å$^{-1}$ in the grazing incidence X-ray diffraction (GIXRD) pattern of an annealed EH-IDTBR thin film.[37] However, EH-IDTBR NPs formed using SDS mostly consisted of a single EH-IDTBR crystal, as indicated by the hexagonal nanoparticle projection and the constant lattice orientation throughout the NP, whereas EH-IDTBR NPs formed using TEBS had a more polycrystalline structure with multiple lattice orientations and visible grain boundaries. The polycrystallinity is attributed to the higher chloroform/water interfacial tension in the presence of TEBS vs. SDS (FIG. 6). This induces more rapid EH-IDTBR nucleation and hence a more polycrystalline NP structure. Two component PTB7-Th:EH-IDTBR particles formed using SDS typically exhibit a crystalline phase in the particle core surrounded by a thin amorphous shell. The lattice spacing of the crystalline domain is close to that observed in pure EH-IDTBR (1.7 nm), and the lattice planes have the same orientation throughout the crystalline domain, which suggests that the particle core is formed from a single EH-IDTBR crystal. In a 95 nm diameter particle shown in (e) of FIG. 8, the crystalline core radius is approximately 42 nm, and the amorphous shell radius is approximately 5 nm. Modelling the particle as a sphere, and assuming equal densities of PTB7-Th and EH-IDTBR (FIG. 10) shows that the volume of the core and shell domains is consistent with the 30:70 PTB7-Th:EH-IDTBR mass ratio in the blend.

Figure 16:
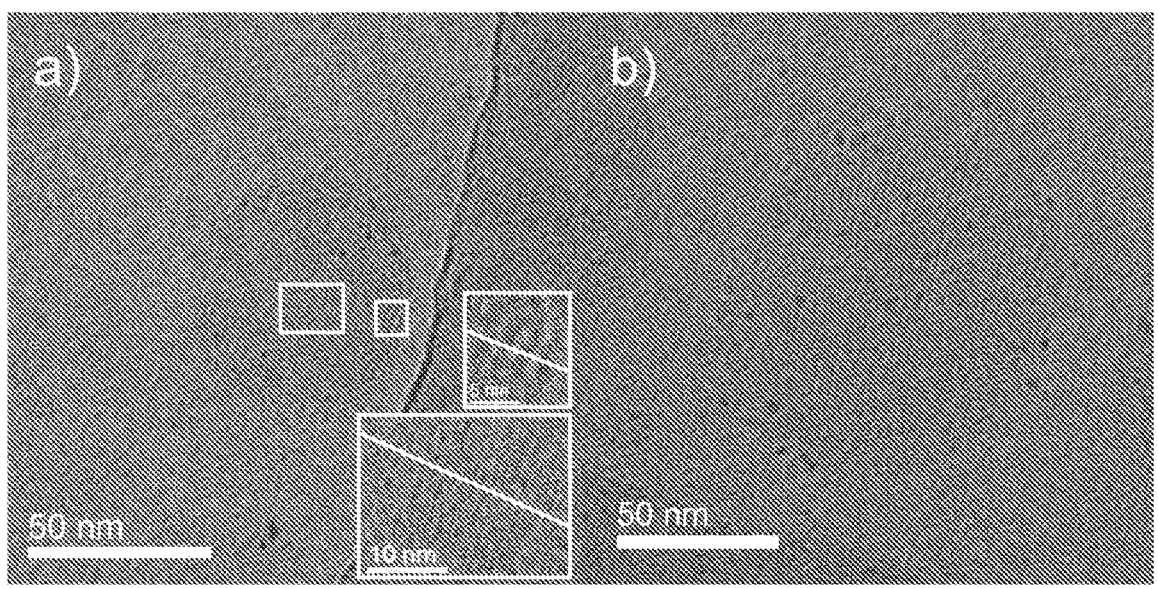
FIG. 16 shows Cryo-TEM images of NPs after deposition of Pt cocatalyst and 20 h $H_2$ evolution according to one embodiment of the present disclosure.

FIG. 16 provides cryo TEM images of NPs after deposition of Pt co-catalyst and 20 h H$_2$ evolution. a) PTB7-Th:EH-IDTBR 30:70 (SDS). The upper and lower insets are magnified images of the areas in the right and left rectangles respectively. The periodic spacings along the diagonal lines in the upper and lower insets correspond to the lamellar stacking distances of PTB7-Th (2.1 nm) and EH-IDTBR (1.6 nm) respectively (FIG. 20).[37,38] b) PTB7-Th/EH-IDTBR 30:70 (TEBS).

Figure 20:
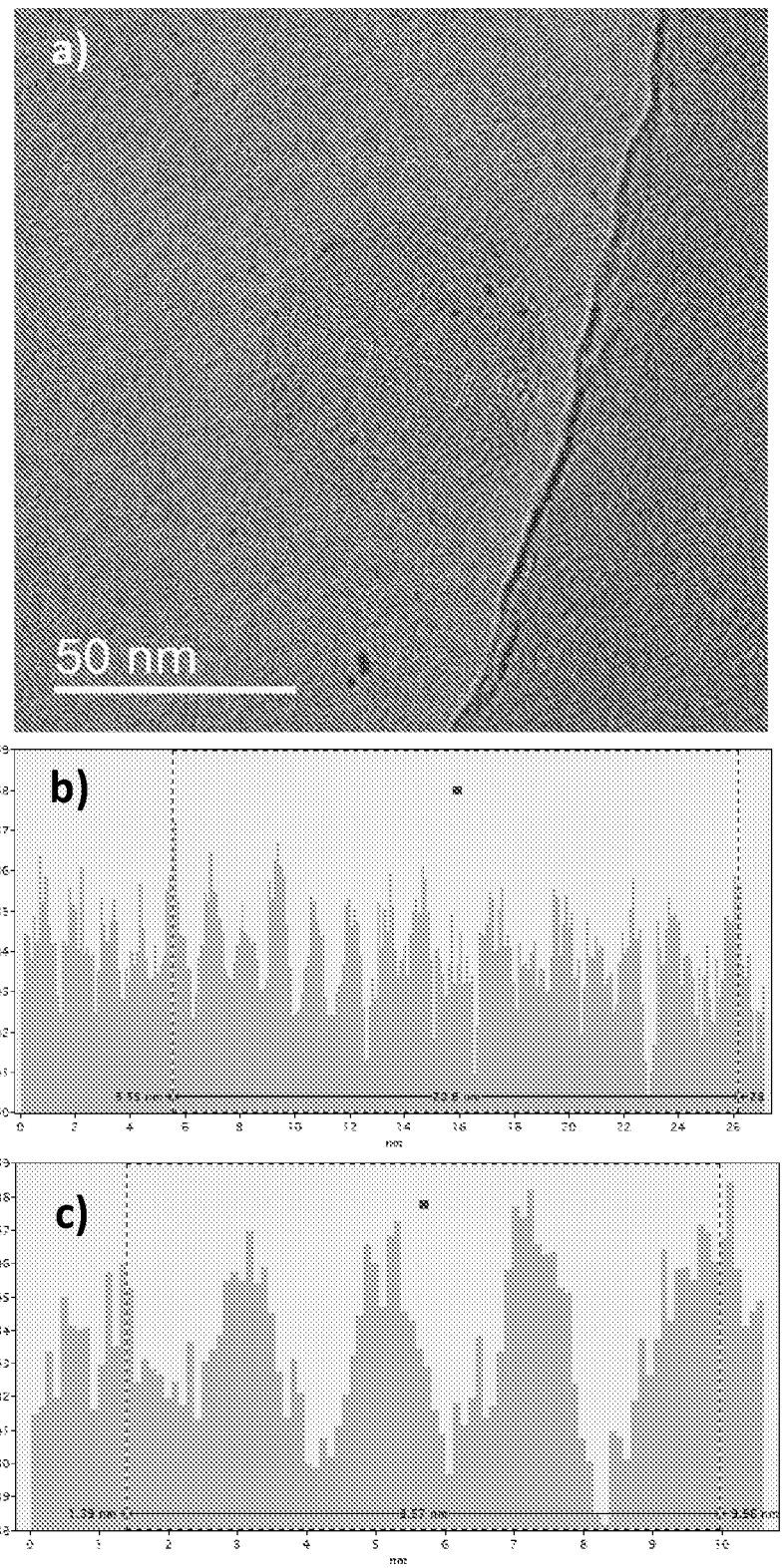
FIG. 20 provides a cryo TEM image analysis of PTB7-Th:EH-IDTBR 30:70 (SDS) after deposition of Pt co-catalyst and 20 h $H_2$ evolution according to one embodiment of the present disclosure.

FIG. 20 provides a cryo TEM image analysis of PTB7-Th:EH-IDTBR 30:70 (SDS) after deposition of Pt co-catalyst and 20 h H$_2$ evolution. (a) of FIG. 20 illustrates an image of a nanoparticle highlighting analysis areas. (b) of FIG. 20 graphically illustrates a profile along the long axis of the area in the blue rectangle on the left-hand side. Average D-spacing=1.58 nm (c) of FIG. 20 Profile along the long axis of the area in the lower blue rectangle. Average D-spacing=2.14 nm.

Furthermore, the 30:70 PTB7-Th:EH-IDTBR NPs formed using SDS occasionally display an additional periodic spacing in the shell (2.14 nm, (a) of FIG. 16) which corresponds to the lamellar stacking distance of PTB7-Th determined by GIXRD.[38] Both these observations strongly suggest that that the NPs formed using SDS are composed of a crystalline EH-IDTBR core surrounded by an amorphous PTB7-Th shell, which is in agreement with the interfacial tensions measured in the presence of SDS (FIG. 6) as well as the trend in HER rate vs. blend composition ((a-b) of FIG. 4). Two component PTB7-Th:EH-IDTBR NPs formed using TEBS comprise a distributed blend of crystalline and amorphous domains. The crystalline domains showed two different lattice spacings: 1.9 nm and 3.2 nm, both of which correspond to minor peaks in the GIXRD pattern of an EH-IDTBR film at Q=0.33 Å$^{-1}$ and 0.19 Å$^{-1}$ respectively.[37] This suggests that the rapid crystallisation invoked by TEBS can give rise to multiple EH-IDTBR polymorphs forming within the NP, as has been previously observed in P3HT:EH-IDTBR blend films.[39] Therefore, based on the 30:70 mass ratio of PTB7-Th and EH-IDTBR within the NP, the crystalline regions with 1.9 and 3.2 nm lattice spacings are both assigned to EH-IDTBR. The lack of any apparent radial segregation between the PTB7-Th and EH-IDTBR within the NP, and an approximately equal distribution of PTB7-Th and EH-IDTBR at the NP surface is consistent with the interfacial tensions measured in the presence of TEBS (FIG. 6) as well the dramatically increased HER rates achieved with NPs formed using TEBS vs. SDS.

Figure 17:
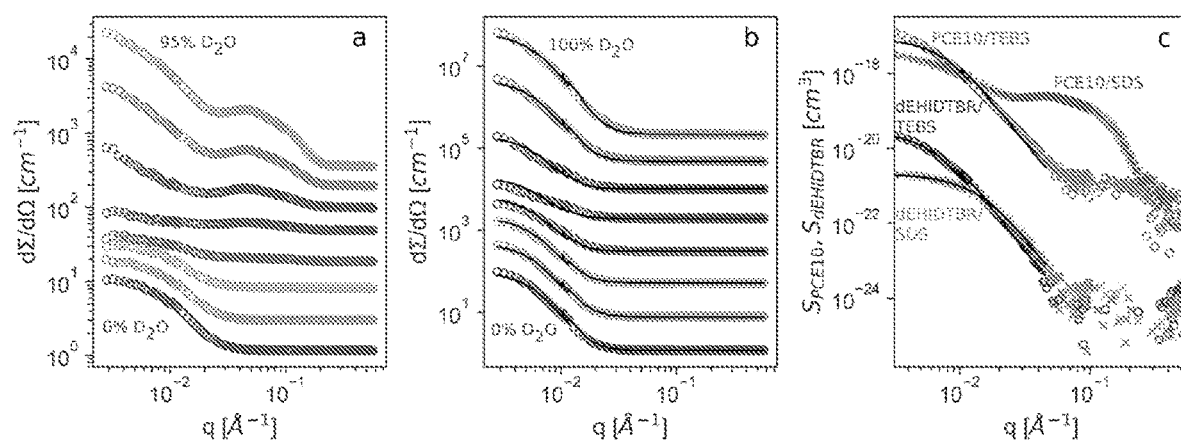
FIG. 17 is a graphical illustration of small-angle neutron scattering according to one embodiment of the present disclosure.

FIG. 17 illustrates small-angle neutron scattering (a, b) and deconstructed partial scattering functions (c) for PTB7-Th (PCE10):dEH-IDTBR nanoparticles in H$_2$O/D$_2$O solutions with SDS (a) or TEBS (b) surfactants. In all plots, solid-black lines represent a spherical form-factor model fits to the data. In parts a and b, the curves are successively shifted by $10^{0.5}$ and $10^{0.9}$ respectively, while the upper two curves in part c are both shifted by $10^4$. Small-angle neutron scattering (SANS) (FIG. 17) of blend NPs of PTB7-Th and deuterated EH-IDTBR (dEH-IDTBR) in D$_2$O/H$_2$O solutions further supports the morphological analysis from the cryo-TEM. In (a) of FIG. 17, NPs formed using SDS surfactant near the contrast match point of PTB7-Th (volume fraction of 24.7% D$_2$O) indicate a spherical dEH-IDTBR core. At contrast conditions near those of dEH-IDTBR (volume fraction of 82.0% D$_2$O), a large feature emerges at a middle-q range between (0.02<q<0.2) Å$^{-1}$. Despite the visual appearance of the NPs in (e) of FIG. 8, no core-shell model could be fit to the full range of data shown. This includes core-shell models with varying number of shell layers and varying mathematical descriptions of the layer interfaces. To further understand the data, select disclosed embodiments decomposed the contrast series into partial scattering functions ((c) of FIG. 17) which isolate the contributions from the PTB7-Th ($S_{PTB7-Th}(q)$) and dEH-IDTBR ($S_{dEH-IDTBR}(q)$) to the total scattering function, $$\frac{d\Sigma}{\Omega}(q).$$

[40] This analysis clearly shows that the mid-q feature arises from the PTB7-Th domain while the dEH-IDTBR scattering is described well by a spherical form-factor model. Taken together, these data describe the particle as having a spherical dEH-IDTBR core and a PTB7-h domain(s) that displays a broad secondary length-scale. Given the cryo-TEM analysis, this secondary length scale likely still describes a shell-like feature, but there is some additional structural complexity that is not captured in the core-shell models explored here (e.g., local aggregation of PTB7-Th on core-surface, or PTB7-Th/SDS mixed morphologies). The NPs formed using TEBS also showed no significant secondary length scale at any SANS contrast condition ((b) of FIG. 17). Simultaneous fits to the spherical form factor model with the radius (R) and log-normal dispersity $$\left(\frac{dR}{R}\right)$$

parameters constrained across contrast conditions yield reasonable fits $$\left(R = 10.2nm, \frac{dR}{R} = 0.57\right).$$

The decomposed partial scattering functions ((c) of FIG. 17) also show spherical behaviour, with $S_{dEH-IDTBR}(q)$ displaying a better fit than $S_{PTB7-Th}(q)$. The deviations in $S_{PTB7-Th}(q)$ along with those of the full scattering curves at intermediate contrast conditions ((b) of FIG. 17) indicate that there is microstructure that is not perfectly described by a spherical model. These observations are likely related to the multiple amorphous and crystalline domains observed in the cryo-TEM ((f) of FIG. 8). Overall, the SANS analysis indicates that the blend NPs prepared with TEBS are more intermixed than their SDS counterparts, consistent with the transition from a core-shell NP morphology to a more intermixed D/A heterojunction NP. This is further supported by Kelvin probe force microscopy (KPFM, FIG. 15) which shows that the workfunction of the blend NPs formed with TEBS is greater than that of those formed with SDS; suggesting a more EH-IDTBR rich surface in the TEBS-formed NPs.

Figure 21:
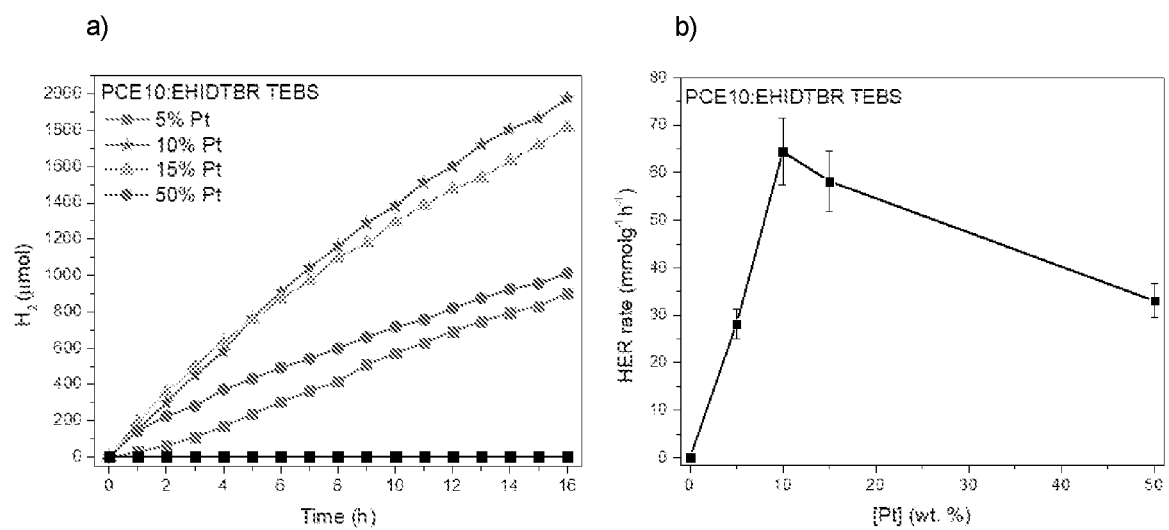
FIG. 21 graphically illustrates $H_2$ evolution vs. time and average HER rates of optimised NP photocatalysts with varying Pt loadings according to one embodiment of the present disclosure.

The photodeposited Pt co-catalyst decorates the surface of the PTB7-Th:EH-IDTBR NPs (FIG. 16) and facilitates electron transfer from the photocatalyst to protons in the aqueous phase by providing sites for proton adsorption and electron accumulation.[26,41] FIG. 21 graphically illustrates (a) $H_2$ evolution vs. time (b) Average HER rates over 16 h of optimised NP photocatalysts (PTB7-TH:EH-IDTBR 30:70 TEBS) with varying Pt loadings. Conditions: 2 mg PTB7-TH:EH-IDTBR nanoparticles, 0.2 M ascorbic acid (20 mL), pH 2,300 W Xe lamp (350-800 nm), 16 $cm^2$ reactor. Optimizing the Pt loading further increased the HER rate of the best performing NPs (30:70 mass ratio PTB7-Th:EH-IDTBR TEBS) to a maximum of 64,426±7022 µmolh−1g−1 at 10% Pt (FIG. 21). In accordance with disclosed embodiments, this is by far the highest mass normalized HER rate reported to date for any organic HEP under broadband visible light irradiation.[7,21,42] Measuring the EQEs of the NPs over a range of wavelengths ((a) of FIG. 18) revealed that the NPs were highly active throughout the visible spectrum; achieving EQEs of 2.0%, 2.3%, 4.3%, 5.6% and 6.2% at 400, 500, 620, 660, and 700 nm respectively. This is in contrast to state of the art CNx HEPs which can achieve higher EQEs at wavelengths <450 nm but are inactive above 500 nm due to their wide bandgaps.[7] High EQEs at wavelengths >500 nm are essential for the photocatalyst to efficiently utilize photons in the region of maximum solar photon flux, and hence achieve high ηSTH.[8] The EQEs of the PTB7-Th:EH-IDTBR NPs at wavelengths ≥500 nm are significantly higher than those reported for any organic HEP to date,[7,21,42] and make the PTB7-Th:EH-IDTBR HEPs particularly attractive for use in a Z-scheme in conjunction with an efficient wide bandgap OEP such as $WO_3$[10] or $BiVO_4$[11] that is only active at wavelengths <500 nm.

Figure 18:
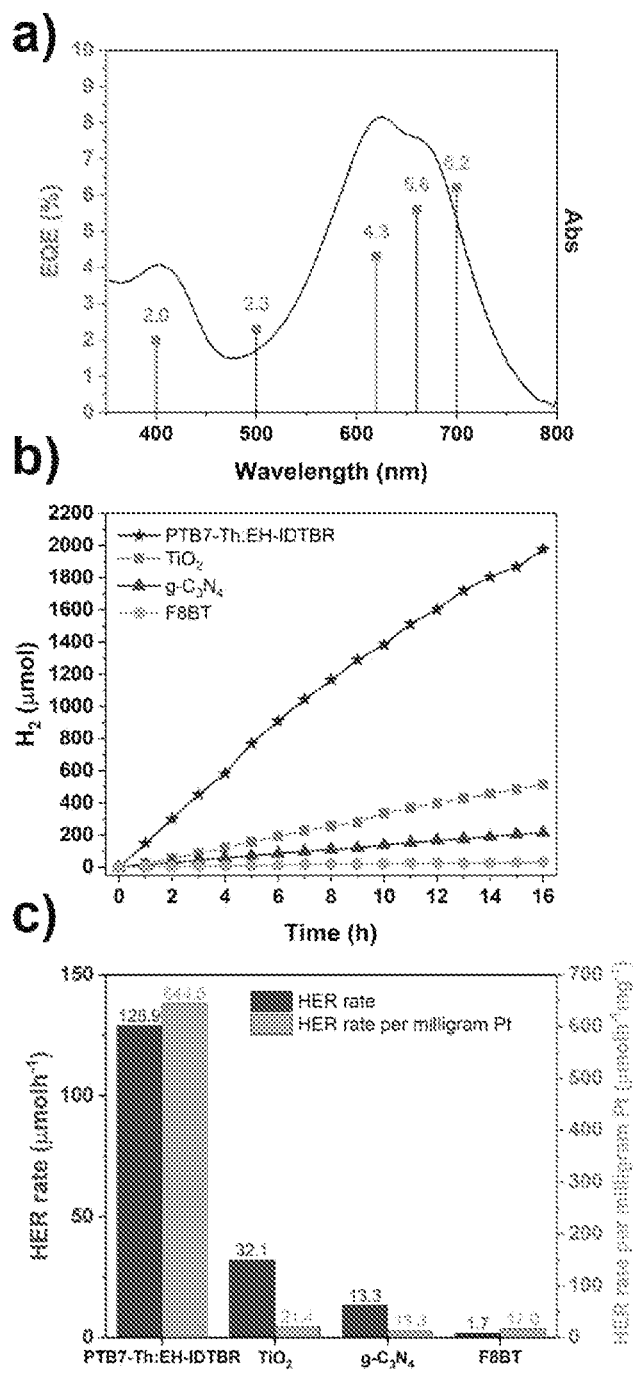
FIG. 18 is a graphical illustration of external quantum efficiencies and performance comparisons according to one embodiment of the present disclosure.
Figure 22:
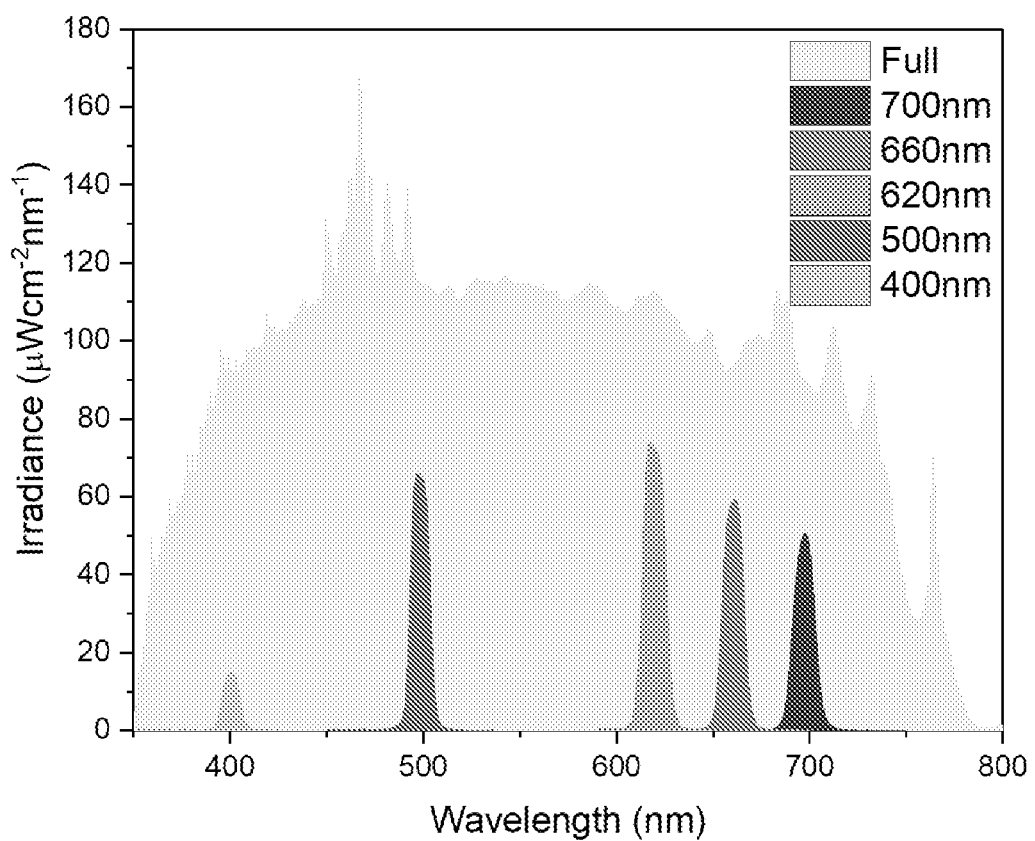
FIG. 22 graphically illustrates average irradiance over a reactor area of Xe lamp used for $H_2$ evolution and external quantum efficiency measurements according to one embodiment of the present disclosure.

FIG. 18 is a graphical illustrates of external quantum efficiencies and performance comparisons of the present disclosure: (a) External quantum efficiencies at 400, 500, 620, 660 and 700±10 nm and absorbance spectrum of PTB7-Th:EH-IDTBR 30:70 mass ratio (TEBS) nanoparticle photocatalysts. (b) $H_2$ evolution vs. time, (c) Average $H_2$ evolution rates of a range of photocatalysts measured over 16 h. Conditions: PTB7-Th:EH-IDTBR: 2 mg photocatalyst, 10% Pt, 20 mL 0.2 mol/L ascorbic acid (AA). P25 $TiO_2$: 100 mg photocatalyst, 1.5% Pt, 20 mL 10% triethanolamine (TEOA). $gC_3N_4$: 100 mg photocatalyst, 1% Pt 20 mL 10% TEOA. F8BT: 2 mg photocatalyst, 5% Pt, 20 mL 0.2 mol/L AA. Note: HER rates were higher for $TiO_2$ and $gC_3N_4$ with TEOA instead of AA as the sacrificial hole scavenger. In one disclosed embodiment, irradiance spectra may be found in accordance with FIG. 22. As shown, FIG. 22 graphically illustrates average irradiance over a reactor area of Xe lamp used for $H_2$ evolution and external quantum efficiency measurements.

The HER rate of the optimised PTB7-Th:EH-IDTBR NP photocatalysts was compared to a range of benchmark materials measured in the same reactor, under illumination from the same light source ((b-c) of FIG. 18). To ensure a fair comparison between photocatalysts, the HER rates were measured under saturated conditions (0% light transmission through the reactor throughout the photocatalyst's absorption range).[43] The Pt loadings of g-$C_3N_4$ (1%)[44] $TiO_2$ (1.5%)[45] and F8BT (5%)[26] were chosen based on previously reported optima, and the photocatalytic activities reported for g-$C_3N_4$ and $TiO_2$ are the higher of two measurements taken in the presence of different sacrificial reagents (ascorbic acid or triethanolamine). HER rates were compared in terms of the absolute amount of $H_2$ produced per hour.[46] The average HER rate over 16 h of the PTB7-Th:EH-IDTBR NP photocatalysts (128.9 µmolh$^{-1}$) was over 4 times higher than that of $TiO_2$ (32.1 µmolh$^{-1}$), almost 10 times higher than that of commercial g-$C_3N_4$ (13.3 µmolh$^{-1}$), and over 75 times higher than poly(9,9-dioctylfluorene-alt-benzothiadiazole) (F8BT) NPs (1.7 µmolh$^{-1}$), a commonly studied single component conjugated polymer photocatalyst.[26,47] Although the optimum Pt loading (10%) was significantly higher for the PTB7-Th:EH-IDTBR NPs than for the other photocatalysts, when comparing photocatalytic activities in terms of HER rate per total mass of Pt used ((d) of FIG. 18) the activity of the PTB7-Th:EH-IDTBR NPs rises even further above the g-$C_3N_4$ and $TiO_2$ benchmarks. This is because the strong light absorption and efficient charge generation of the PTB7-Th:EH-IDTBR NPs allows them to produce significantly more photogenerated charges per unit mass of photocatalyst.

Table 2 provides a comparison of $H_2$ evolution activity of optimised PTB7-TH:EH-IDTBR NPs with a range of benchmark materials.

TABLE 2

| Photocatalyst | Pt loading (μg) | HER rate (μmolh$^{-1}$) | TOF Pt (h$^{-1}$) |
|---|---|---|---|
| PTB7-Th:EH-IDTBR | 20 | 128.9 | 125.7 |
| P25 TiO2 | 1500 | 32.1 | 4.2 |
| g-$C_3N_4$ | 1000 | 13.3 | 2.6 |
| F8BT | 10 | 1.7 | 33.2 |

Turnover frequency (TOF) over 16 h may be calculated using the following equation:

$$TOF = \frac{\text{mol} H_2 h^{-1}}{\text{mol} Pt}$$

This increases the turnover frequency of the Pt co-catalyst (Table 2) compared to the benchmark photocatalysts, which is highly advantageous in terms of both cost and scalability.[48]

Disclosed embodiments demonstrate the fabrication of organic NP HEPs with an internal D/A semiconductor heterojunction, which significantly improves charge generation inside the NP bulk, and thus greatly enhances photocatalytic activity compared to NPs formed from a single organic semiconductor. By varying the stabilizing surfactant employed during NP fabrication, it is possible to optimize the heterojunction morphology from an unfavorable core-shell structure to a more intimately mixed blend. This improved charge extraction from the NPs and increased the HER rate of PTB7-Th:EH-IDTBR NPs by almost an order of magnitude, leading to the unprecedentedly high HER rate of 64,426±7022 μmolh$^{-1}$g$^{-1}$ under broadband visible light illumination, photocatalytic activity throughout the visible spectrum, and EQEs exceeding 5% at 660 to 700 nm. The EQEs at wavelengths >500 nm are the highest reported for any organic HEP to date, and may provide a pathway to increased ηSTH of current Z-schemes via improved visible light utilization. Furthermore, the NP fabrication and heterojunction optimization process provides a platform for the vast library of existing soluble organic semiconductors to be processed into NP photocatalysts energetically tailored to drive a wide range of redox chemistries including OWS, $CO_2$ reduction,[49] and $N_2$ fixation,[50] which all rely on the same fundamental photon-to-electron conversion processes as photocatalytic hydrogen evolution.

Examples

Methods:
Nanoparticle Fabrication:

Individual stock solutions (0.50 mg/mL) of PTB7-TH and EH-IDTBR were prepared in chloroform. The solutions were heated for 10 mins-24 h (at approximately 80° C.) to ensure complete dissolution and filtered using a syringe filter with a PTFE membrane with a pore size of 0.2 μm. Nanoparticle precursor solutions were prepared from the stock solutions by mixing them in the ratio of the desired nanoparticle composition (0-100% EH-IDTBR). 1-10 mL of the nanoparticle precursor solution was then added to an approximately 0.1-1 wt. % solution of surfactant (SDS or TEBS) in water (approximately 5-50 mL), and stirred vigorously for approximately 1-5 min at approximately 20-80° C. to form a pre-emulsion, which was then sonicated for approximately 1-10 min with an ultrasonic processor (Sonics VibraCell VCX130PB) to form a mini-emulsion. The mini-emulsion was heated at approximately 60-120° C. under a stream of air to remove the chloroform, leaving a surfactant stabilized nanoparticle dispersion in water. Finally, the dispersion was filtered using a syringe filter with a glass fibre membrane with a pore size of approximately 0.45 μm to remove any large aggregates or debris from the processor tip.

Dynamic Light Scattering (DLS):

The size distribution of each nanoparticle batch was measured by dynamic light scattering (DLS, Malvern Zetasizer ZS, FIG. 1, Table 1). FIG. 1 shows that all NP batches had unimodal size distributions and that the $Z_{avg}$ hydrodynamic diameter between batches remained relatively constant at 50-80 nm regardless of whether SDS or TEBS was used as the stabilising surfactant. TEBS narrowed the NP size distributions and slightly increased the $Z_{avg}$ NP size for all PTB7-TH:EH-IDTBR ratios, but overall all NP batches were of a similar size. This is important when comparing HER rates between batches, because NP size affects the total available surface area, which would likely affect the HER rate. Having samples with similar size distributions minimizes this variation and allows the effects of nanoparticle composition and morphology to be isolated.

Transmission Electron Microscopy (TEM):

Cryo Transmission Electron Microscopy (cryoTEM) of the samples was carried out with a Titan Krios 80-300 TEM from Thermo-Fisher Scientific, USA. This microscope is optimized for carrying out cryoTEM analysis of liquid samples. It is also equipped with an energy-filter of model GIF Quantum 968 from Gatan, Inc., USA, underneath the column to filter the energy-loss electrons to improve the contrast in the acquired images. Moreover, behind the GIF column, a highly sensitive direct electron complementary metal oxide semiconductor (CMOS) camera of model K2, also from Gatan, Inc., USA, was installed for the recording of high-resolution images at extremely low electron dose conditions (~1 e/Å2). Specimen preparation of samples for cryoTEM analysis was carried out by using an automated plunge-freezing tool of model Vitrobot Mark-IV. Moreover, the specimens were prepared with a special type of copper TEM-grid of model Quatifoil MultiA. These grids have a carbon layer with various size holes and were chosen with a purpose of varying ice-thickness in the holes. In this way, the chance of organic particles being present in the specimen was dramatically higher than with the single hole-size carbon containing grid. Each specimen was prepared by placing 3.5 micro-litre of solution onto grids followed by 1 second of blotting-time and plunge-freezing into liquid ethane cryogen. The cryoTEM analysis was performed by setting the microscope at the accelerating voltage of 300 kV. Prior to the analysis, the microscope as well as GIF were aligned to have higher quality images. Furthermore, the images were recorded under so called dose-fractionation conditions. In fact, instead of acquiring a single frame with total electron beam exposure time, the images were acquired in stacks that contained frames whose exposure time was more than ten times smaller than the total exposure time. The acquired stacks were then aligned and summed along z-direction in order to have final images. This exercise of image-recording ensured higher quality images of organic particles with as minimum damage as possible. The total electron dose given to images, acquired at low-magnifications (<50,000×) was kept below 10 e/Å². Whereas, higher magnification images (>100,000×) received the electron dose of about 20 e/Å² so as to maintain a good signal-to-noise condition. It is to be noted that the entire image acquisition as well as processing was performed using Gatan Microscopy Suite of version 3.2.

Hydrogen Evolution:

Hydrogen evolution from PTB7-TH/EH-IDTBR nanoparticles was measured using ascorbic acid (AA) as a sacrificial electron donor. PTB7-TH/EH-IDTBR nanoparticles with varying PTB7-TH:EH-IDTBR ratios (2 mg) in 0.2 M AA (20 mL) were loaded into a recirculating batch reactor (area=452 mm²) which has been previously reported.[43] The desired Pt loading was achieved by adding a specific amount of aqueous potassium hexachloroplatinate solution (0.401 mg/mL Pt). The reactor was evacuated and purged with Ar 5 times to remove oxygen, and the pressure was set to 100 Torr. The suspension was stirred and illuminated with a 300 W Xe lamp (Asahi Max 303) fitted with a UV-vis mirror module (350-800 nm) and $H_2$ evolution was quantified by a gas chromatograph equipped with a thermal conductivity detector. The same method was used to measure $H_2$ evolution from $TiO_2$ and g-$C_3N_4$, except in this case 100 mg of photocatalyst was used, and the reaction was carried out either in 0.2 M AA, or 10 vol. % triethanolamine.

Figure 19:
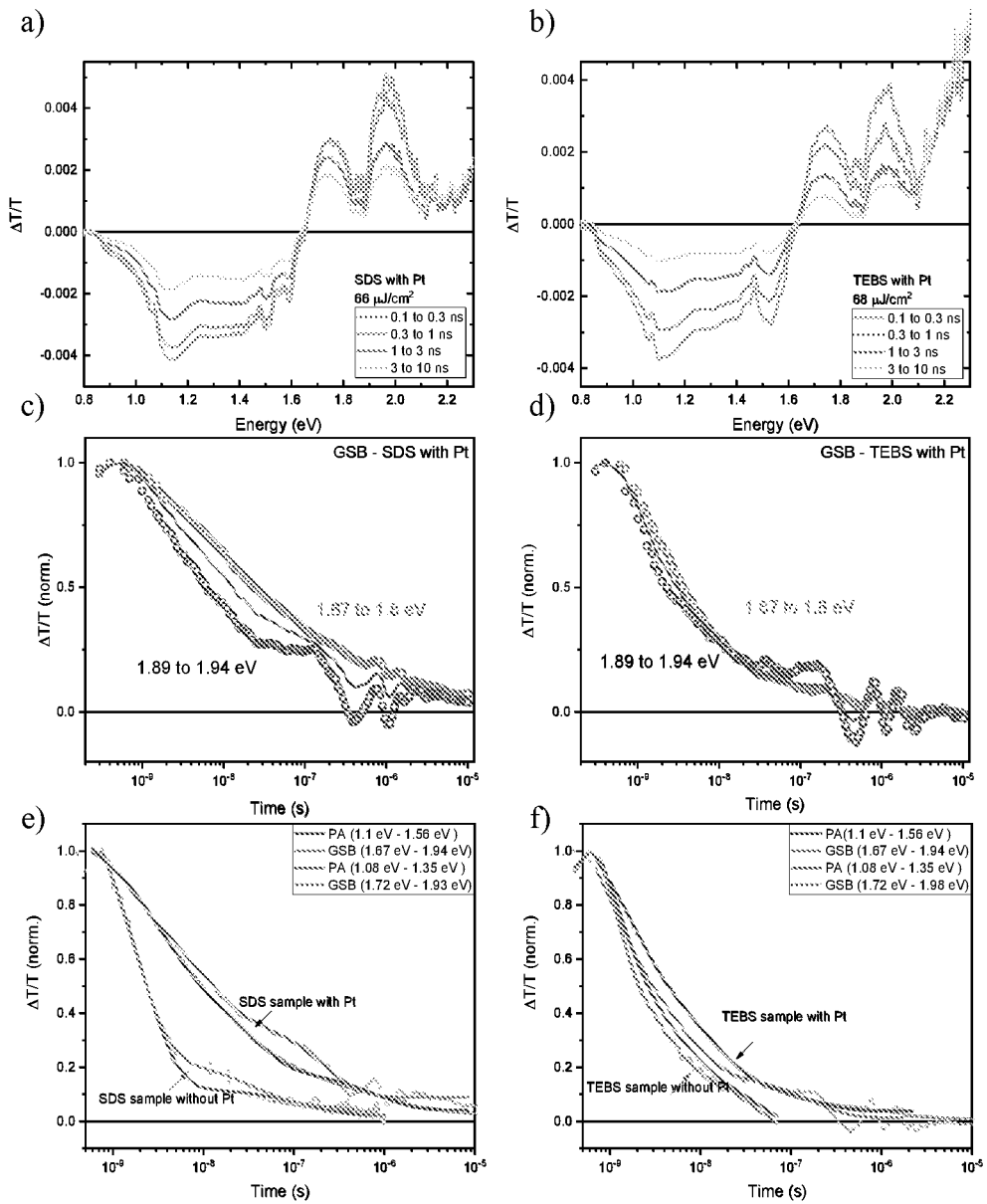
FIG. 19 is a graphical illustration of ns-transient absorption (TA) spectra of NPs containing photodeposited Pt (10% mass fraction) prepared with SDS and TEBS according to one embodiment of the present disclosure.

EQE Measurements:

EQE measurements were carried out in the same way as hydrogen evolution measurements, but with suitable band pass filters fitted to the light source. The sample was first illuminated under unfiltered light (350-800 nm) for 4 h to complete Pt photodeposition. Then the reactor was evacuated and purged with Ar 5 times to remove all of the $H_2$ evolved during this time. The light source was fitted with a band pass filter, and illuminated with filtered light within a narrow wavelength range (irradiance spectra in FIG. 19). The EQE was calculated using Equation 1, where $nH_2$ represents the number of moles of $H_2$ evolved per hour, and n photons represents the total number of photons incident on the reactor per hour. Photon flux was measured using a calibrated spectrometer (Ocean Optics USB2000 calibrated with an Ocean Optics DH3-plus light source) fitted with a fibre optic cable and a 0.4778 cm² cosine corrector.

$$EQE(\%) = \frac{200nH_2}{n\,\text{photons}} \qquad \text{Equation 1}$$

Atomic Force Microscopy:

Nanoparticles were drop-cast on ITO coated glass substrates and characterized with a SOLVER NEXT SPM (NT-MDT) using an atomic force microscopy (AFM) measuring head. To confirm the core-shell morphology, samples were placed in a plasma-asher (HPT-100, Henniker plasma) for two ten second periods, a few nanometers of material was removed from the surface of the nanoparticles. Topography and surface potential were measured in semi-contact mode using a 20 nm PtIr-coated conductive 0.01-0.025 Ohm-cm Antimony (n) doped Si cantilever (SCM-PIT, Veeco). The cantilever had a resonant frequency and stiffness of 60-100 kHz and 1-5 N/m, respectively. The work-function of the tip was estimated by measuring the contact potential difference ($V_{CPD}$) of a gold standard (5.1 eV) from Digital Instruments Veeco Metrology Group and using the equation:

$$V_{CPD} = \frac{\phi_{tip} - \phi_{sample}}{-e} \qquad \text{Equation 2}$$

Where $\phi$ is the work-function and e the charge of an electron. The work-function of the tip was found to be 5.05 eV (mean $V_{CPD}$ for gold=50 mV from (e) of FIG. 15). To confirm, a commercial ITO sample was measured (f) of FIG. 15) and the work-function estimated as 4.84 eV (mean $V_{CPD}$ for ITO=−213 mV).

Figure 7:
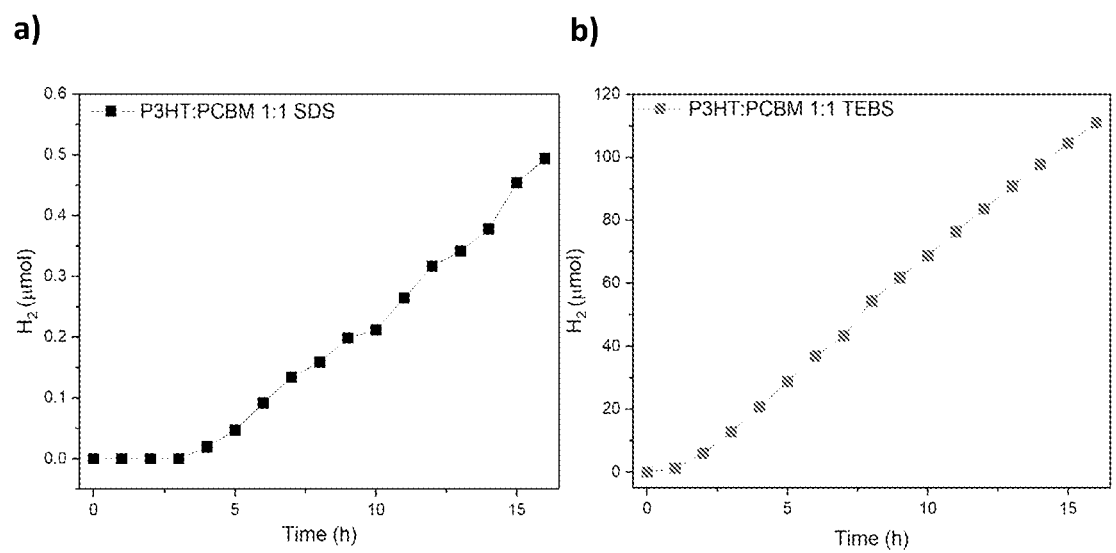
FIG. 7 is a graphical illustration of $H_2$ evolution vs. time of P3HT:PCBM 1:1 NPs formed using SDS and TEBS surfactants according to one embodiment of the present disclosure.

Surface and Interfacial Tension Measurements:

Surface and interfacial tensions were measured with a Kruss Tensiometer using the ring method. The probe was rinsed in water and heated until it was red hot. The glass vessel used to hold the liquid was cleaned with acetone and rinsed with water. To confirm no contamination, before each measurement, the surface tension of water was measured. The liquid to be measured was placed in the glass vessel, and the temperature allowed to equilibrate for 30 min. The concentration of TEBS or SDS in deionized water was 0.5 wt % and for PTB7-TH or EH-IDTBR 0.5 mg/ml in chloroform. The surface tension measurements were performed by attaching the probe to the balance. The glass vessel containing the liquid to be measured was raised until the probe was just above the liquid. The probe and liquid were slowly brought together until in contact with one another.

Where F is the force acting on the balance. The contact angle can be assumed to be zero as the plate is roughened platinum and optimally wetted. The plate method can be used for interfacial tension, but the light phase should have a lower surface tension than the heavy phase. Which is not the case (FIG. 6 and FIG. 7). Select disclosed embodiments, therefore, use the ring method. An advantage of the ring method is the wetted length is greater than the plate method. Which leads to a greater force on the balance and more accurate results. This effect is not relevant for surface tension, only interfacial tension, but for comparison some disclosed embodiments have performed surface tension measurements (FIG. 7). After contact with the liquid, the sample is lowered until a maximum force (Fmax) on the ring is recorded. The interfacial tension was calculated according to Equation 3.

$$\sigma = \frac{F_{max} - F_v}{L \cdot \cos\theta} \qquad \text{Equation 3}$$

Where $F_v$ is the weight of liquid volume, L the wetted length, and e the contact angle. $\Theta=0$ because the force vector is parallel to the direction of motion. A Harkins and Jordan correction factor is applied to correct for the curvature of the film being greater on the inside than the outside of the ring. The results of the interfacial tension measurements are shown in FIG. 6.

Having described the many embodiments of the present disclosure in detail, it will be apparent that modifications and variations are possible without departing from the scope of the invention defined in the appended claims. Furthermore, it should be appreciated that all examples in the present disclosure, while illustrating many embodiments of the invention, are provided as non-limiting examples and are, therefore, not to be taken as limiting the various aspects so illustrated.

REFERENCES

The following references are referred to above and are incorporated herein by reference:

1. Hoffert, M. I. et al. Advanced technology paths to global climate stability: energy for a greenhouse planet. *Science* 298, 981-7 (2002).
2. Creutzig, F. et al. The underestimated potential of solar energy to mitigate climate change. *Nat. Energy* 2, 17140 (2017).
3. Pinaud, B. A. et al. Technical and economic feasibility of centralized facilities for solar hydrogen production via photocatalysis and photoelectrochemistry. *Energy Environ. Sci.* 6, 1983 (2013).
4. FUJISHIMA, A. & HONDA, K. Electrochemical Photolysis of Water at a Semiconductor Electrode. *Nature* 238, 37-38 (1972).
5. Goto, Y. et al. A Particulate Photocatalyst Water-Splitting Panel for Large-Scale Solar Hydrogen Generation. *Joule* 2, 509-520 (2018).
6. Wang, X. et al. A metal-free polymeric photocatalyst for hydrogen production from water under visible light. *Nat. Mater.* 8, 76-80 (2009).
7. Zhang, G. et al. Ionothermal Synthesis of Triazine-Heptazine-Based Copolymers with Apparent Quantum Yields of 60% at 420 nm for Solar Hydrogen Production from "Sea Water". *Angew. Chemie Int. Ed.* 57, 9372-9376 (2018).
8. Maeda, K. & Domen, K. Photocatalytic Water Splitting: Recent Progress and Future Challenges. *J. Phys. Chem. Lett.* 1, 2655-2661 (2010).
9. Wang, Y. et al. Mimicking Natural Photosynthesis: Solar to Renewable $H_2$ Fuel Synthesis by Z-Scheme Water Splitting Systems. *Chem. Rev.* 118, 5201-5241 (2018).
10. Bamwenda, G. R. & Arakawa, H. The visible light induced photocatalytic activity of tungsten trioxide powders. *Appl. Catal. A Gen.* 210, 181-191 (2001).
11. Zhu, M., Sun, Z., Fujitsuka, M. & Majima, T. Z-Scheme Photocatalytic Water Splitting on a 2D Heterostructure of Black Phosphorus/Bismuth Vanadate Using Visible Light. *Angew. Chemie Int. Ed.* 57, 2160-2164 (2018).
12. Kim, J. H. & Lee, J. S. Elaborately Modified BiVO 4 Photoanodes for Solar Water Splitting. *Adv. Mater.* 31, 1806938 (2019).
13. Zhang, P., Zhang, J. & Gong, J. Tantalum-based semiconductors for solar water splitting. *Chem. Soc. Rev.* 43, 4395-4422 (2014).
14. Yuan, Y.-J., Chen, D., Yu, Z.-T. & Zou, Z.-G. Cadmium sulfide-based nanomaterials for photocatalytic hydrogen production. *J. Mater. Chem. A* 6, 11606-11630 (2018).
15. Zhu, X. et al. Black Phosphorus Revisited: A Missing Metal-Free Elemental Photocatalyst for Visible Light Hydrogen Evolution. *Adv. Mater.* 29, 1605776 (2017).
16. Sachs, M. et al. Understanding structure-activity relationships in linear polymer photocatalysts for hydrogen evolution. *Nat. Commun.* 9, 4968 (2018).
17. Zhang, X. et al. Biomass Nanomicelles Assist Conjugated Polymers/Pt Cocatalysts To Achieve High Photocatalytic Hydrogen Evolution. *ACS Sustain. Chem. Eng.* 7, 4128-4135 (2019).
18. Banerjee, T. & Lotsch, B. V. The wetter the better. *Nat. Chem.* 10, 1175-1177 (2018).
19. Mikhnenko, O. V., Blom, P. W. M. & Nguyen, T.-Q. Exciton diffusion in organic semiconductors. *Energy Environ. Sci.* 8, 1867-1888 (2015).
20. Sun, C. et al. Interface design for high-efficiency non-fullerene polymer solar cells. *Energy Environ. Sci.* 10, 1784-1791 (2017).
21. Wang, X. et al. Sulfone-containing covalent organic frameworks for photocatalytic hydrogen evolution from water. *Nat. Chem.* 10, 1180-1189 (2018).
22. Takanabe, K. et al. Photocatalytic hydrogen evolution on dye-sensitized mesoporous carbon nitride photocatalyst with magnesium phthalocyanine. *Phys. Chem. Chem. Phys.* 12, 13020 (2010).
23. Low, J., Yu, J., Jaroniec, M., Wageh, S. & Al-Ghamdi, A. A. Heterojunction Photocatalysts. *Adv. Mater.* 29, 1601694 (2017).
24. Richards, J. J., Whittle, C. L., Shao, G. & Pozzo, L. D. Correlating Structure and Photocurrent for Composite Semiconducting Nanoparticles with Contrast Variation Small-Angle Neutron Scattering and Photoconductive Atomic Force Microscopy. *ACS Nano* 8, 4313-4324 (2014).
25. Wang, L. et al. Organic Polymer Dots as Photocatalysts for Visible Light-Driven Hydrogen Generation. *Angew. Chemie Int. Ed.* 55, 12306-12310 (2016).
26. Kosco, J. et al. The Effect of Residual Palladium Catalyst Contamination on the Photocatalytic Hydrogen Evolution Activity of Conjugated Polymers. *Adv. Energy Mater.* 1802181 (2018). doi:10.1002/aenm.201802181
27. Liu, A., Tai, C.-W., Hold, K. & Tian, H. Hollow polymer dots: nature-mimicking architecture for efficient photocatalytic hydrogen evolution reaction. *J. Mater. Chem. A* 7, 4797-4803 (2019).
28. Trasatti, S. The absolute electrode potential: an explanatory note (Recommendations 1986). *J. Electroanal. Chem. Interfacial Electrochem.* 209, 417-428 (1986).
29. Staff, R. H., Landfester, K. & Crespy, D. Recent Advances in the Emulsion Solvent Evaporation Technique for the Preparation of Nanoparticles and Nanocapsules. in 329-344 (Springer, Chan, 2013). doi:10.1007/12_2013_233
30. Cha, H. et al. Suppression of Recombination Losses in Polymer:Nonfullerene Acceptor Organic Solar Cells due to Aggregation Dependence of Acceptor Electron Affinity. *Adv. Energy Mater.* 9, 1901254 (2019).
31. Schwarz, K. N., Farley, S. B., Smith, T. A. & Ghiggino, K. P. Charge generation and morphology in P3HT:PCBM nanoparticles prepared by mini-emulsion and reprecipitation methods. *Nanoscale* 7, 19899-19904 (2015).
32. Ulum, S. et al. Determining the structural motif of P3HT:PCBM nanoparticulate organic photovoltaic devices. *Sol. Energy Mater. Sol. Cells* 110, 43-48 (2013).
33. Holmes, N. P. et al. Nano-domain behaviour in P3HT:PCBM nanoparticles, relating material properties to morphological changes. *Sol. Energy Mater. Sol. Cells* 117, 437-445 (2013).
34. Ge, X. et al. Four reversible and reconfigurable structures for three-phase emulsions: extended morphologies and applications. *Sci. Rep.* 7, 42738 (2017).
35. Subianto, S. et al. Sulfonated Thiophene Derivative Stabilized Aqueous Poly(3-hexylthiophene):Phenyl-$C_{61}$-butyric Acid Methyl Ester Nanoparticle Dispersion for Organic Solar Cell Applications. *ACS Appl. Mater. Interfaces* 10, 44116-44125 (2018).

36. Baran, D. et al. Robust nonfullerene solar cells approaching unity external quantum efficiency enabled by suppression of geminate recombination. *Nat. Commun.* 9, 2059 (2018).
37. Holliday, S. Extended Linear Acceptors with an Indacenodithiophene Core. in 63-85 (Springer, Chan, 2018). doi:10.1007/978-3-319-77091-8_4
38. Huang, L. et al. Vertical Stratification Engineering for Organic Bulk-Heterojunction Devices. *ACS Nano* 12, 4440-4452 (2018).
39. Holliday, S. et al. High-efficiency and air-stable P3HT-based polymer solar cells with a new non-fullerene acceptor. *Nat. Commun.* 7, 11585 (2016).
40. Endo, H., Schwahn, D. & Colfen, H. On the role of block copolymer additives for calcium carbonate crystallization: Small angle neutron scattering investigation by applying contrast variation. *J. Chem. Phys.* 120, 9410-9423 (2004).
41. McKone, J. R., Marinescu, S. C., Brunschwig, B. S., Winkler, J. R. & Gray, H. B. Earth-abundant hydrogen evolution electrocatalysts. *Chem. Sci.* 5, 865-878 (2014).
42. Stegbauer, L., Schwinghammer, K. & Lotsch, B. V. A hydrazone-based covalent organic framework for photocatalytic hydrogen production. *Chem. Sci.* 5, 2789-2793 (2014).
43. Qureshi, M. & Takanabe, K. Insights on Measuring and Reporting Heterogeneous Photocatalysis: Efficiency Definitions and Setup Examples. *Chem. Mater.* 29, 158-167 (2017).
44. Maeda, K. et al. Photocatalytic Activities of Graphitic Carbon Nitride Powder for Water Reduction and Oxidation under Visible Light. *J. Phys. Chem. C* 113, 4940-4947 (2009).
45. Haselmann, G. M. & Eder, D. Early-Stage Deactivation of Platinum-Loaded $TiO_2$ Using In Situ Photodeposition during Photocatalytic Hydrogen Evolution. *ACS Catal.* 7, 466-4675 (2017).
46. Zhang, G., Lan, Z.-A. & Wang, X. Conjugated Polymers: Catalysts for Photocatalytic Hydrogen Evolution. *Angew. Chemie Int. Ed.* 55, 15712-15727 (2016).
47. Pati, P. B. et al. An experimental and theoretical study of an efficient polymer nano-photocatalyst for hydrogen evolution. *Energy Environ. Sci.* 10, 1372-1376 (2017).
48. Zou, X. & Zhang, Y. Noble metal-free hydrogen evolution catalysts for water splitting. *Chem. Soc. Rev.* 44, 5148-5180 (2015).
49. Yu, J., Low, J., Xiao, W., Zhou, P. & Jaroniec, M. Enhanced Photocatalytic $CO_2$-Reduction Activity of Anatase $TiO_2$ by Coexposed {001} and {101} Facets. *J. Am. Chem. Soc.* 136, 8839-8842 (2014).
50. Li, H., Shang, J., Ai, Z. & Zhang, L. Efficient Visible Light Nitrogen Fixation with BiOBr Nanosheets of Oxygen Vacancies on the Exposed {001} Facets. *J. Am. Chem. Soc.* 137, 6393-6399 (2015).

All documents, patents, journal articles and other materials cited in the present application are incorporated herein by reference.

While the present disclosure has been disclosed with references to certain embodiments, numerous modification, alterations, and changes to the described embodiments are possible without departing from the sphere and scope of the present disclosure, as defined in the appended claims. Accordingly, it is intended that the present disclosure not be limited to the described embodiments, but that it has the full scope defined by the language of the following claims, and equivalents thereof.

What is claimed is:

1. A nanoparticle comprising:
    an internal D/A heterojunction;
    the nanoparticle having a surface of PTB7-Th:EH-IDTBR decorated with a photodeposited Pt co-catalyst,
    wherein the nanoparticle comprises a HER rate of $64,426 \pm 7022$ $\mu molh^{-1}g^{-1}$ at 10% Pt.

2. The nanoparticle of claim 1, wherein the nanoparticle comprises 30:70 mass ratio PTB7-Th:EH-IDTBR TEBS.

3. The nanoparticle of claim 1, wherein measured external quantum efficiencies (EQEs) of the nanoparticle throughout a visible spectrum exceed 5% at 660 to 700 nm.

4. The nanoparticle of claim 1, wherein measured external quantum efficiencies (EQEs) of the nanoparticle over a range of wavelengths throughout a visible spectrum comprise: 2.0%, 2.3%, 4.3%, 5.6% and 6.2% at 400, 500, 620, 660, and 700 nm, respectively.

5. A nanoparticle comprising:
    an internal D/A heterojunction,
    wherein the nanoparticle comprises a HER rate of $64,426 \pm 7022$ $\mu molh^{-1}g^{-1}$ under broadband visible light illumination.

6. A nanoparticle of claim 5, wherein the nanoparticle has a surface of PTB7-Th:EH-IDTBR decorated with a photodeposited Pt co-catalyst, wherein the nanoparticle comprises a HER rate of $64,426 \pm 7022$ $\mu molh^{-1}$ $g^{-1}$ at 10% Pt.

7. The nanoparticle of claim 5, wherein the nanoparticle comprises 30:70 mass ratio PTB7-Th:EH-IDTBR TEBS.

8. The nanoparticle of claim 5, wherein measured external quantum efficiencies (EQEs) of the nanoparticle throughout a visible spectrum exceed 5% at 660 to 700 nm.

9. The nanoparticle of claim 5, wherein measured external quantum efficiencies (EQEs) of the nanoparticle over a range of wavelengths throughout a visible spectrum comprise: 2.0%, 2.3%, 4.3%, 5.6% and 6.2% at 400, 500, 620, 660, and 700 nm, respectively.

10. A semiconductor device comprising:
    nanoparticles having an internal D/A heterojunction;
    the nanoparticles having surfaces of PTB7-Th:EH-IDTBR decorated with a photodeposited Pt co-catalyst,
    wherein the nanoparticles comprises a HER rate of $64,426 \pm 7022$ $\mu molh^{-1}$ $g^{-1}$ at 10% Pt.

11. The semiconductor device of claim 10, wherein the nanoparticles comprises 30:70 mass ratio PTB7-Th:EH-IDTBR TEBS.

12. The semiconductor device of claim 10, wherein measured external quantum efficiencies (EQEs) of the nanoparticles throughout a visible spectrum exceed 5% at 660 to 700 nm.

13. The semiconductor device of claim 10, wherein measured external quantum efficiencies (EQEs) of the nanoparticles over a range of wavelengths throughout a visible spectrum comprise: 2.0%, 2.3%, 4.3%, 5.6% and 6.2% at 400, 500, 620, 660, and 700 nm, respectively.

14. A semiconductor device comprising:
    nanoparticles having an internal D/A heterojunction,
    wherein the nanoparticles comprise a HER rate of $64,426 \pm 7022$ $\mu molh^{-1}$ $g^{-1}$ under broadband visible light illumination.

15. A semiconductor device of claim 14, wherein the nanoparticles have a surface of PTB7-Th:EH-IDTBR decorated with a photodeposited Pt co-catalyst, wherein the nanoparticles comprise a HER rate of $64,426 \pm 7022$ $\mu molh^{-1}g^{-1}$ at 10% Pt.

16. The semiconductor device of claim 14, wherein measured external quantum efficiencies (EQEs) of the nanoparticles throughout a visible spectrum exceed 5% at 660 to 700 nm.

17. The semiconductor device of claim 14, wherein measured external quantum efficiencies (EQEs) of the nanoparticles over a range of wavelengths throughout a visible spectrum comprise: 2.0%, 2.3%, 4.3%, 5.6% and 6.2% at 400, 500, 620, 660, and 700 nm, respectively.

18. A semiconductor device comprising:
nanoparticles having an internal D/A heterojunction;
the nanoparticles having surfaces of PTB7-Th:EH-IDTBR decorated with a photodeposited Pt co-catalyst,
wherein the semiconductor device comprises an $H_2$ evolution rate of over 60,000 $\mu molh^{-1} g^{-1}$ under 350 to 800 nm illumination and external quantum efficiencies (EQEs) over 6% in a region of maximum solar photon flux.

19. A method of fabricating a nanoparticle comprising:
preparing individual stock solutions of PTB7-TH and EH-IDTBR in chloroform;
heating the individual stock solutions at approximately 80° C. to a complete dissolution;
filtering the individual stock solutions;
preparing a nanoparticle precursor solution from the filtered individual stock solutions by mixing the individual stock solutions in a ratio of 0-100% EH-IDTBR
adding approximately 1-10 mL of the nanoparticle precursor solution to approximately 0.1-1 wt. % solution of surfactant (SDS or TEBS) in approximately 5-50 mL of water and mixing for approximately 15 min at approximately 40° C. to form a pre-emulsion;
sonicating the pre-emulsion for approximately 5 min to form a mini-emulsion;
heating the mini-emulsion at approximately 85° C. under a stream of air to remove the chloroform to thereby form a surfactant stabilized nanoparticle dispersion in water; and
filtering the nanoparticle to remove any large aggregates or debris.

20. A method of fabricating a nanoparticle comprising:
preparing individual stock solutions of PTB7-TH and EH-IDTBR in chloroform;
heating the individual stock solutions to a complete dissolution;
filtering the individual stock solutions;
preparing a nanoparticle precursor solution from the filtered individual stock solutions by mixing the individual stock solutions in a ratio of 0-100% EH-IDTBR
adding a portion of the nanoparticle precursor solution to a solution of surfactant (SDS or TEBS) in water and mixing to form a pre-emulsion;
sonicating the pre-emulsion to form a mini-emulsion;
heating the mini-emulsion to remove the chloroform to thereby form a surfactant stabilized nanoparticle dispersion; and
filtering the nanoparticle.

\* \* \* \* \*